US012796386B2

(12) United States Patent
Lin et al.

(10) Patent No.: US 12,796,386 B2
(45) Date of Patent: Nov. 10, 2026

(54) AUTOMATED MATERIAL HANDLING SYSTEM

(71) Applicant: Taiwan Semiconductor Manufacturing Company Limited, Hsin-Chu (TW)

(72) Inventors: Yu-Zhu Lin, Hsinchu City (TW); Chieh Hsu, Hsinchu City (TW); Guancyun Li, Hsinchu City (TW); Ching-Jung Chang, Taichung City (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 376 days.

(21) Appl. No.: 18/524,416

(22) Filed: Nov. 30, 2023

(65) Prior Publication Data

US 2025/0183078 A1 Jun. 5, 2025

(51) Int. Cl.
*H10P 72/30* (2026.01)
*H10P 72/00* (2026.01)

(52) U.S. Cl.
CPC ...... *H10P 72/3402* (2026.01); *H10P 72/0462* (2026.01); *H10P 72/0464* (2026.01); *H10P 72/3604* (2026.01)

(58) Field of Classification Search
CPC ............. H10P 72/3402; H10P 72/0462; H10P 72/0464; H10P 72/3604; H10P 72/3221;
(Continued)

(56) References Cited

U.S. PATENT DOCUMENTS 10,255,785 B1 * 4/2019 Huang ............... G01N 27/4141
2008/0156618 A1 * 7/2008 Brain .................. B65G 37/005
700/226

(Continued)

FOREIGN PATENT DOCUMENTS

CN 107922113 A 4/2018
CN 117088054 A 11/2023
TW 201139252 A 11/2011

OTHER PUBLICATIONS

Office Action received in corresponding Taiwanese patent application No. 113102734, dated Apr. 30, 2025, 22 pages.

*Primary Examiner* — Saul Rodriguez
*Assistant Examiner* — Jaimin G Patel
(74) *Attorney, Agent, or Firm* — Cooper Legal Group, LLC

(57) ABSTRACT

A method of transporting a first carrier is provided. The method includes responsive to a processing station being scheduled to receive a semiconductor wafer that is carried by the first carrier, moving a first transport vehicle from a first track to a second track via a first junction while the first carrier is supported by a first carrier support component of the first transport vehicle. The method includes transferring the first carrier from the first carrier support component to the buffer support component while the first transport vehicle is engaged with the second track. The method includes responsive to the processing station being available to receive the semiconductor wafer, transferring the first carrier from the buffer support component to a second carrier support component of the second transport vehicle. The method includes transferring the first carrier from the second carrier support component to the processing station.

20 Claims, 20 Drawing Sheets

(58) Field of Classification Search
CPC ............. H10P 72/3216; H10P 72/3208; H10P 72/3222; H10P 72/0612; H10P 72/3218
See application file for complete search history.

(56) References Cited

U.S. PATENT DOCUMENTS

| | | | | |
|---|---|---|---|---|
| 2008/0275582 | A1* | 11/2008 | Nettles | G06Q 10/06 700/100 |
| 2010/0215461 | A1* | 8/2010 | Kamikawa | H10P 72/3216 414/222.13 |
| 2010/0242783 | A1* | 9/2010 | Oguro | H10P 72/3208 104/91 |
| 2017/0229333 | A1* | 8/2017 | Kinugawa | H10P 72/3208 |
| 2018/0122671 | A1* | 5/2018 | Niiyama | H10P 72/3208 |
| 2018/0222686 | A1* | 8/2018 | Takahara | B65G 17/485 |
| 2018/0229936 | A1* | 8/2018 | Motoori | B61B 1/005 |
| 2019/0115234 | A1* | 4/2019 | Ogawa | B65G 1/137 |
| 2020/0130931 | A1* | 4/2020 | Motoori | B65G 1/0407 |
| 2021/0043487 | A1* | 2/2021 | Goto | H10P 72/3221 |
| 2022/0340370 | A1* | 10/2022 | Kono | B65G 43/08 |
| 2022/0406638 | A1* | 12/2022 | Li | H10P 72/3208 |

* cited by examiner

AUTOMATED MATERIAL HANDLING SYSTEM

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more semiconductor fabrication processes are performed to form semiconductor devices on, in, and/or from a semiconductor wafer. The semiconductor wafer is transferred to stations used to perform the one or more semiconductor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
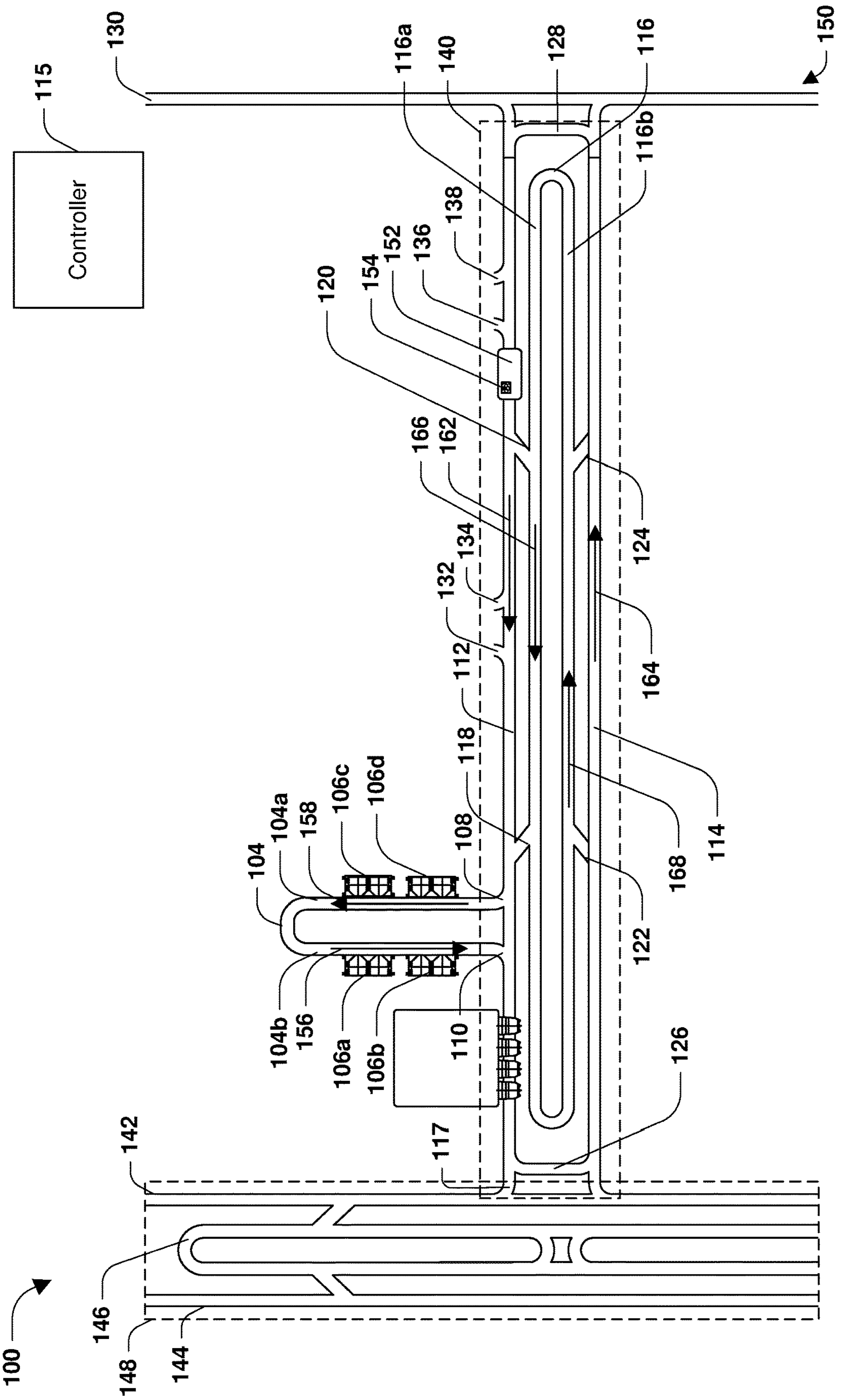
FIG. 1A illustrates a top view of an automated material handling system, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, an automated material handling system uses a transport track system to facilitate movement of transport vehicles. In some embodiments, a transport vehicle of the automated material handling system is used to transport a carrier to a processing station in a semiconductor manufacturing environment. In some embodiments, the transport track system comprises a first track and a second track. In some embodiments, the automated system comprises one or more buffer support components proximal the second track. In some embodiments, the one or more buffer support components are used to temporarily store one or more carriers carrying semiconductor wafers that are waiting to be received by the processing station to undergo a process, such as a semiconductor fabrication process, scheduled for the semiconductor wafers. In some embodiments, a carrier of the one or more carriers is transferred from a transport vehicle to a buffer support component of the one or more buffer support components while the transport vehicle is engaged with the second track, thereby allowing the carrier to be transferred to the buffer support component without obstructing the first track. In some embodiments, the carrier is transferred from the buffer support component to the processing station once the processing station is available to receive the carrier. Thus, in accordance with some embodiments, the present disclosure provides for at least one of (i) increased speed with which a carrier is transferred to the processing station responsive to the processing station becoming available to process a semiconductor wafer carried by the carrier, (ii) increased production efficiency of the processing station as a result of transferring carriers to the processing station with increased speed, or (iii) reduced traffic throughout the track system as a result reducing congestion along the first track.

FIGS. 1-6 illustrates aspects associated with an automated material handling system 100 according to some embodiments. FIGS. 1A-1M illustrate transporting a first carrier 154 using the automated material handling system 100, according to some embodiments. In some embodiments, the automated material handling system 100 comprises transport vehicles configured to transport carriers carrying semiconductor wafers. In some embodiments, the automated material handling system 100 comprises a first transport track system 150 configured to facilitate movement of a transport vehicle to transport a semiconductor wafer to one or more locations within a semiconductor manufacturing environment. In some embodiments, the automated material handling system 100 comprises a controller 115 configured to manage movement of transport vehicles along one or more tracks of the first transport track system 150.

FIG. 1A illustrates a top view of the automated material handling system 100, according to some embodiments. In some embodiments, the semiconductor manufacturing environment comprises a first processing station 102. In some embodiments, the first processing station 102 comprises a semiconductor fabrication station. In some embodiments, the first processing station 102 is configured to perform a process, such as a semiconductor fabrication process, on a semiconductor wafer. In some embodiments, although one processing station 102 is illustrated any number of processing stations are contemplated. In some embodiments, the first processing station 102 comprises at least one of (i) cleaning equipment, such as a cleaning tool comprising a cleaning tank in which a semiconductor wafer is at least one of washed, cleaned, etc., (ii) physical vapor deposition (PVD) equipment, (iii) plating equipment, (iv) etching equipment, such as at least one of plasma etching equipment, wet etching equipment, dry etching equipment, reactive-ion etching (RIE) equipment, atomic layer etching (ALE) equipment, buffered oxide etching equipment, or ion beam milling equipment, (v) lithography equipment, (vi) chemical mechanical planarization (CMP) equipment, (vii) chemical vapor deposition (CVD) equipment, (viii) a furnace, such as a semiconductor furnace tool, or (ix) other equipment.

In some embodiments, a first transport vehicle 152 of the automated material handling system 100 is configured to support the first carrier 154. In some embodiments, the first carrier 154 is configured to carry a first semiconductor wafer 204 (shown in FIG. 2). In some embodiments, the first transport vehicle 152 comprises at least one of an overhead transport vehicle, a guided transport vehicle that travels on predetermined routes or tracks, a forklift, or other suitable vehicle.

In some embodiments, the first transport track system 150 comprises a plurality of tracks. In some embodiments, each track of one, some, or all of the plurality of tracks comprises one or more rails, races, sidewalls, etc. and is configured to accommodate the first transport vehicle 152. In some embodiments, each track of one, some, or all of the plurality of tracks comprises at least one of metal, phenolic, nylon, or other suitable material. In some embodiments, at least some of a track of the plurality of tracks is suspended from a ceiling. In some embodiments, at least some of a track of the plurality of tracks is erected from at least one of a floor or a wall. In some embodiments, at least some of a track of the plurality of tracks is erected using a lattice support structure.

In some embodiments, the plurality of tracks comprises at least one of a first track 112, a second track 104, a third track 114, a fourth track 116, a fifth track 126, a sixth track 128, a seventh track 130, an eighth track 142, a ninth track 144, a tenth track 146, or one or more other suitable tracks. In some embodiments, the first transport track system 150 comprises a plurality of track system segments. In some embodiments, the plurality of track system segments comprises at least one of a first track system segment 140, a second track system segment 148, or one or more other suitable track system segments. In some embodiments, the first track system segment 140 comprises an intra-bay segment for transporting a carrier from one location within a bay to another location within the (same) bay. In some embodiments, the bay comprises one or more processing stations, such as the first processing station 102. In some embodiments, the first track system segment 140 comprises at least one of the first track 112, the second track 104, the third track 114, the fourth track 116, the fifth track 126, the sixth track 128, or one or more other suitable tracks. In some embodiments, the second track system segment 148 comprises an inter-bay segment for transporting a carrier from a first bay to a second bay different than the first bay. In some embodiments, the second track system segment 148 comprises at least one of the eighth track 142, the ninth track 144, the tenth track 146, or one or more other suitable tracks.

In some embodiments, the first transport vehicle 152 travels along the first track 112 with the first semiconductor wafer 204 in the first carrier 154. According to some embodiments, the first transport vehicle 152 is maintained on the first track 112 using guide rails, guard rails, etc. The first track 112 forms a pathway for the first transport vehicle 152 to travel from one location to another location within the semiconductor manufacturing environment. In some embodiments, the first track 112 is configured to facilitate movement of a transport vehicle in a first direction 162. In some embodiments, the first transport vehicle 152 travels along the first track 112 in the first direction 162. In some embodiments, the third track 114 is configured to facilitate movement of a transport vehicle in a second direction 164 different than the first direction 162. In some embodiments, the second direction 164 is opposite the first direction 162.

In some embodiments, the second track 104 is connected to the first track 112 via at least one of a first junction 108 or a second junction 110. In some embodiments, the second track 104 comprises a track loop. In some embodiments, the second track 104 comprises a side track. In some embodiments, the second track 104 comprises a first portion **104*a* and a second portion 104*b*. In some embodiments, the first portion 104*a* of the second track 104 is substantially parallel to the second portion 104*b* of the second track 104. In some embodiments, the first portion 104*a* of the second track 104 is configured to facilitate movement of a transport vehicle in a third direction 158. In some embodiments, the second portion 104*b* of the second track 104 is configured to facilitate movement of a transport vehicle in a fourth direction 156 different than the third direction 158. In some embodiments, the fourth direction 156 is opposite the third direction 158. In some embodiments, at least one of the third direction 158 or the fourth direction 156 is substantially perpendicular to at least one of the first direction 162 or the second direction 164. In some embodiments, the first junction 108 comprises a first transfer component (not shown), such as at least one of a switch, a turnout, etc., that facilitates transfer of a transport vehicle traveling along the first track 112 to traveling along the second track 104. In some embodiments, the second junction 110 comprises a second transfer component (not shown), such as at least one of a switch, a turnout, etc., that facilitates transfer of a transport vehicle traveling along the second track 104 to traveling along the first track 112**.

In some embodiments, the fourth track 116 is connected to the first track 112 via at least one of a third junction 118 or a fourth junction 120. In some embodiments, the fourth track 116 is connected to the third track 114 via at least one of a fifth junction 122 or a sixth junction 124. In some embodiments, the fourth track 116 comprises a track loop, such as an inner track loop of the first track system segment 140. In some embodiments, the fourth track 116 comprises a first portion 116*a* and a second portion 116*b*. In some embodiments, the first portion 116*a* of the fourth track 116 is substantially parallel to the second portion 116*b* of the fourth track 116. In some embodiments, the first portion 116*a* of the fourth track 116 is configured to facilitate movement of a transport vehicle in a fifth direction 166. In some embodiments, the second portion 116*b* of the fourth track 116 is configured to facilitate movement of a transport vehicle in a sixth direction 168 different than the fifth direction 166. In some embodiments, the sixth direction 168 is opposite the fifth direction 166. In some embodiments, at least one of the fifth direction 166 or the sixth direction 168 is substantially parallel to at least one of the first direction 162 or the second direction 164. In some embodiments, the third junction 118 comprises a third transfer component (not shown), such as at least one of a switch, a turnout, etc., that facilitates transfer of a transport vehicle traveling along the fourth track 116 to traveling along the first track 112. In some embodiments, the fourth junction 120 comprises a fourth transfer component (not shown), such as at least one of a switch, a turnout, etc., that facilitates transfer of a transport vehicle traveling along the first track 112 to traveling along the fourth track 116. In some embodiments, the fifth junction 122 comprises a fifth transfer component (not shown), such as at least one of a switch, a turnout, etc., that facilitates transfer of a transport vehicle traveling along the third track 114 to traveling along the fourth track 116. In some embodiments, the sixth junction 124 comprises a sixth transfer component (not shown), such as at least one of a switch, a turnout, etc., that facilitates transfer of a transport vehicle traveling along the fourth track 116 to traveling along the third track 114.

In some embodiments, the automated material handling system 100 comprises one or more first buffer support components comprising at least one of a first buffer support component 106*a*, a second buffer support component 106*b*, a third buffer support component 106*c*, or a fourth buffer support component 106*d*. In some embodiments, although four buffer support components are illustrated, any number of buffer support components are contemplated. In some embodiments, the one or more first buffer support components are used to temporarily store one or more carriers carrying one or more semiconductor wafers that are waiting to be received and/or processed using the first processing station 102. In some embodiments, a buffer support component of the one or more first buffer support components is used for storing a carrier that is scheduled to be subject to a process using the first processing station 102. In some embodiments, the buffer support component is used to store the carrier during a time period prior to a time at which the carrier is scheduled to receive and/or process the carrier. In some embodiments, the buffer support component is used to store the carrier while the first processing station 102 is at least one of occupied or not receptive to a semiconductor wafer carried by the carrier. In some embodiments, the buffer support component is used to store the carrier during a down time between a previous process performed on a semiconductor wafer carried by the carrier and a subsequent process scheduled to be performed on the semiconductor wafer using the first processing station 102. In some embodiments, the carrier is transferred from the buffer support component to the first processing station 102 responsive to the first processing station 102 becoming available to receive the semiconductor wafer.

Figure 2:
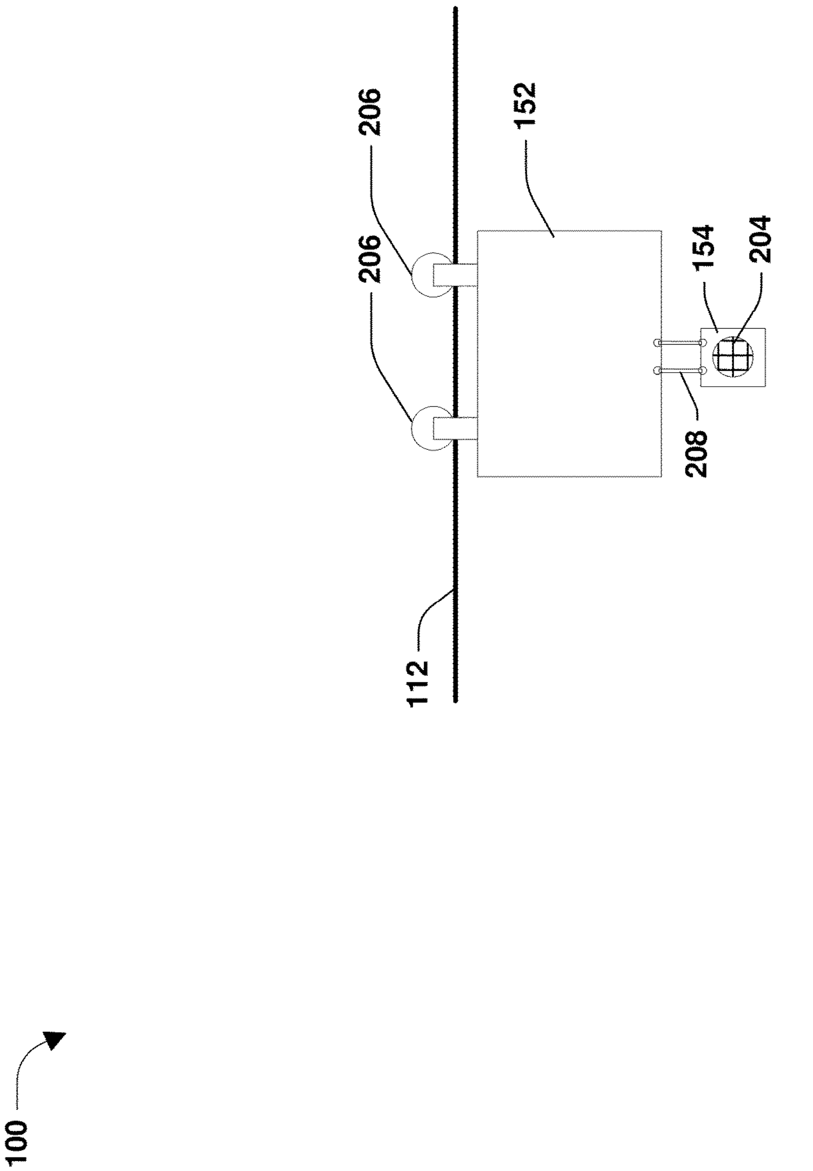
FIG. 2 illustrates a side view of an automated material handling system with a first transport vehicle engaged with a first track, in accordance with some embodiments.

FIG. 2 illustrates the automated material handling system 100 with the first transport vehicle 152 engaged with the first track 112, according to some embodiments. In some embodiments, the first transport vehicle 152 is suspended from the first track 112 via one or more wheels 206 of the first transport vehicle 152. In some embodiments, the first transport vehicle 152 is self-propelled, such as a motorized vehicle. In some embodiments, at least some of the first track 112 comprises a conveyance mechanism such as a chain, belt, motor, compressed air, etc. that moves the first transport vehicle 152 along the first track 112. In some embodiments, at least some of the relative motion between the first transport vehicle 152 and the first track 112 is attributable to the conveyance mechanism. Other embodiments are contemplated and the instant disclosure is not limited to the just described embodiments.

In some embodiments, the first transport vehicle 152 comprises a first carrier support component 208 configured to support the first carrier 154. In some embodiments, the first carrier support component 208 comprises at least one of a belt and pulley system, a robotic arm, a base, or other suitable component. In some embodiments, the first carrier support component 208 selectively engages the first carrier 154 configured to carry the first semiconductor wafer 204 such that the first transport vehicle 152 moves the first carrier 154 and/or the first semiconductor wafer 204 to one or more locations within the semiconductor manufacturing environment.

In some embodiments, the first carrier 154 comprises a wafer storage device. In some embodiments, the wafer storage device comprises at least one of a front opening unified pod (FOUP), a cassette pod, a reticle pod, or other type of wafer storage device. In some embodiments, the wafer storage device is used to store one or more semiconductor wafers comprising the first semiconductor wafer 204. In some embodiments, the one or more semiconductor wafers comprise a batch of wafers. In some embodiments, the one or more semiconductor wafers comprise at least one of one or more substrates, one or more photomasks, one or more semiconductor devices, one or more dies, etc. In some embodiments, the one or more semiconductor wafers are stacked vertically in the wafer storage device. In some embodiments, the one or more semiconductor wafers are supported by a support frame, of the wafer storage device, having at least one of wafer shelves or wafer slots. In some embodiments, a semiconductor wafer stored in the wafer storage device comprises one or more layers, such as at least one of a semiconductor layer, a conductor layer, or an insulator layer.

In some embodiments, at least some transport vehicles of the automated material handling system 100 have one or more of the features, structures, relationships with other elements, etc. provided herein with respect to the first transport vehicle 152.

Figure 1B:
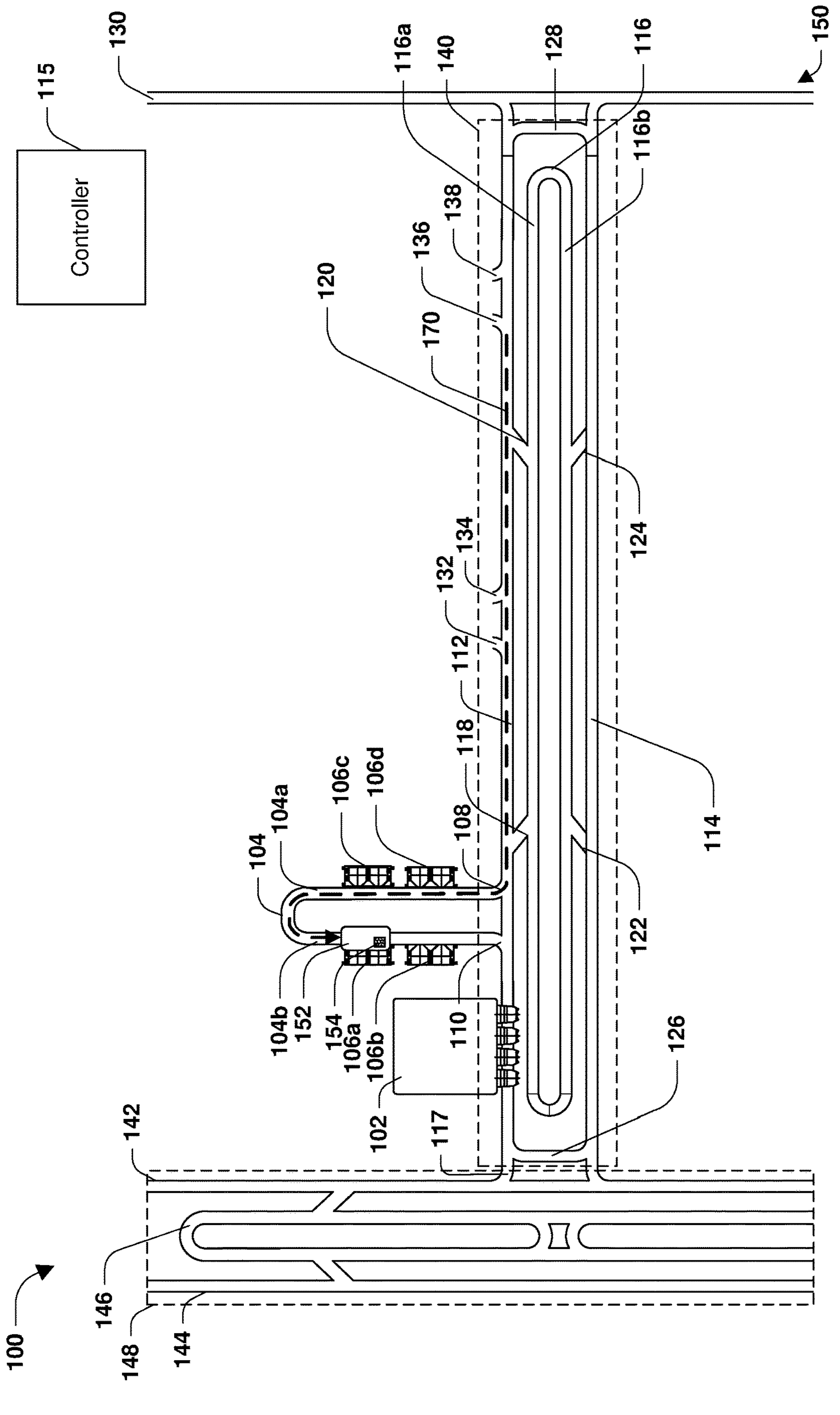
FIG. 1B illustrates a top view of an automated material handling system, in accordance with some embodiments.

FIG. 1B illustrates a first movement operation of the first transport vehicle 152, according to some embodiments. In some embodiments, the first movement operation comprises movement of the first transport vehicle 152 along a first travel path 170. In some embodiments, in the first movement operation, the first transport vehicle 152 travels from a first location of the first track 112 to a second location of the second track 104. In some embodiments, the first transport vehicle 152 travels from the first location of the first track 112 to the second location of the second track 104 responsive to the first processing station 102 being scheduled to receive the first semiconductor wafer 204. In some embodiments, the first processing station 102 is configured to perform a first process on the first semiconductor wafer 204. In some embodiments, the controller 115 instructs the first transport vehicle 152 to travel to the second location of the second track 104 responsive to the first processing station 102 being scheduled to receive the first semiconductor wafer 204. In some embodiments, the first transport vehicle 152 travels from the first track 112 to the second track 104 via the first junction 108. In some embodiments, the controller 115 controls the first transfer component of the first junction 108 to facilitate transfer of the first transport vehicle 152 from traveling along the first track 112 to traveling along the second track 104.

Figure 1C:
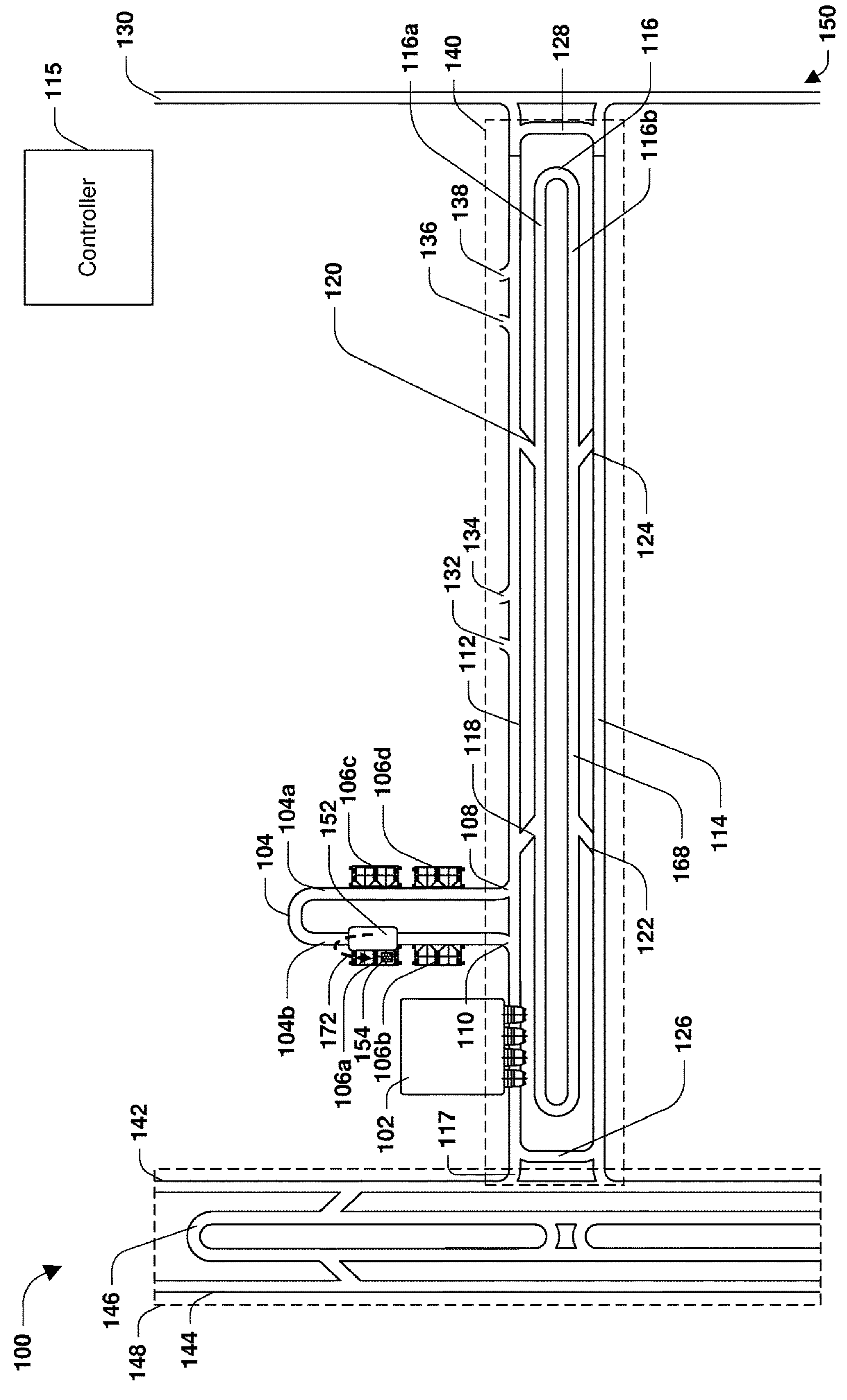
FIG. 1C illustrates a top view of an automated material handling system, in accordance with some embodiments.

FIG. 1C illustrates transfer 172 of the first carrier 154 from the first carrier support component 208 (shown in FIG. 2) to the first buffer support component 106*a*, according to some embodiments. In some embodiments, the first carrier 154 is transferred 172 from the first carrier support component 208 to the first buffer support component 106*a* responsive to the first transport vehicle 152 reaching the second location of the second track 104. In some embodiments, the second location of the second track 104 is proximal the first buffer support component 106*a*. In some embodiments, the first carrier 154 is transferred 172 from the first carrier support component 208 to the first buffer support component 106*a* while the first transport vehicle 152 is engaged with the second track 104, such as while the one or more wheels 206 of the first transport vehicle 152 are at least one of connected to, in direct contact with, or in indirect contact with the second track 104. In some embodiments, the first carrier 154 is transferred 172 from the first carrier support component 208 to the first buffer support component 106*a* using at least one of the first carrier support component 208, a first mechanical device (not shown), or other suitable component. In some embodiments, the first transport vehicle 152 comprises the first mechanical device. In some embodiments, the first transport vehicle 152 does not comprise the first mechanical device. In some embodiments, the first buffer support component 106*a* comprises the first mechanical device. In some embodiments, the controller 115 controls operation of the first mechanical device. In some embodiments, the first carrier support component 208 disengages with the first carrier 154 to release the first carrier 154. In some embodiments, the first buffer support component 106*a* comprises a first shelving unit configured to support the first carrier 154. In some embodiments, the first carrier 154 is set upon the first shelving unit using at least one of the first carrier support component 208 or the first mechanical device.

In some embodiments, after transferring 172 the first carrier 154 from the first carrier support component 208 of the first transport vehicle 152 to the first buffer support component 106*a*, the first transport vehicle 152 is available to perform a first transport operation for transporting a second carrier (not shown) different than the first carrier 154. In some embodiments, responsive to transferring 172 the first carrier 154 from the first carrier support component 208 to the first buffer support component 106*a*, the first transport vehicle 152 travels from the second location of the second track 104 to a different location. In some embodiments, responsive to transferring 172 the first carrier 154 from the first carrier support component 208 to the first buffer support component 106*a*, the controller 115 instructs the first transport vehicle 152 to perform the first transport operation for transporting the second carrier. In some embodiments, responsive to transferring 172 the first carrier 154 from the first carrier support component 208 to the first buffer support component 106*a*, the controller 115 changes a state of the first transport vehicle 152 from occupied state to available state. In some embodiments, when the first transport vehicle 152 is in the available state, the controller 115 includes the first transport vehicle 152 in a list of available transport vehicles. In some embodiments, responsive to identifying the first transport operation associated with transporting the second carrier, the controller 115 selects the first transport vehicle 152 from the list of available transport vehicles to perform the first transport operation. In some embodiments, the controller 115 instructs the first transport vehicle 152 to perform the first transport operation responsive to selecting the first transport vehicle 152. In some embodiments, the first transport vehicle 152 leaves the second track 104 via the second junction 110.

Figure 1D:
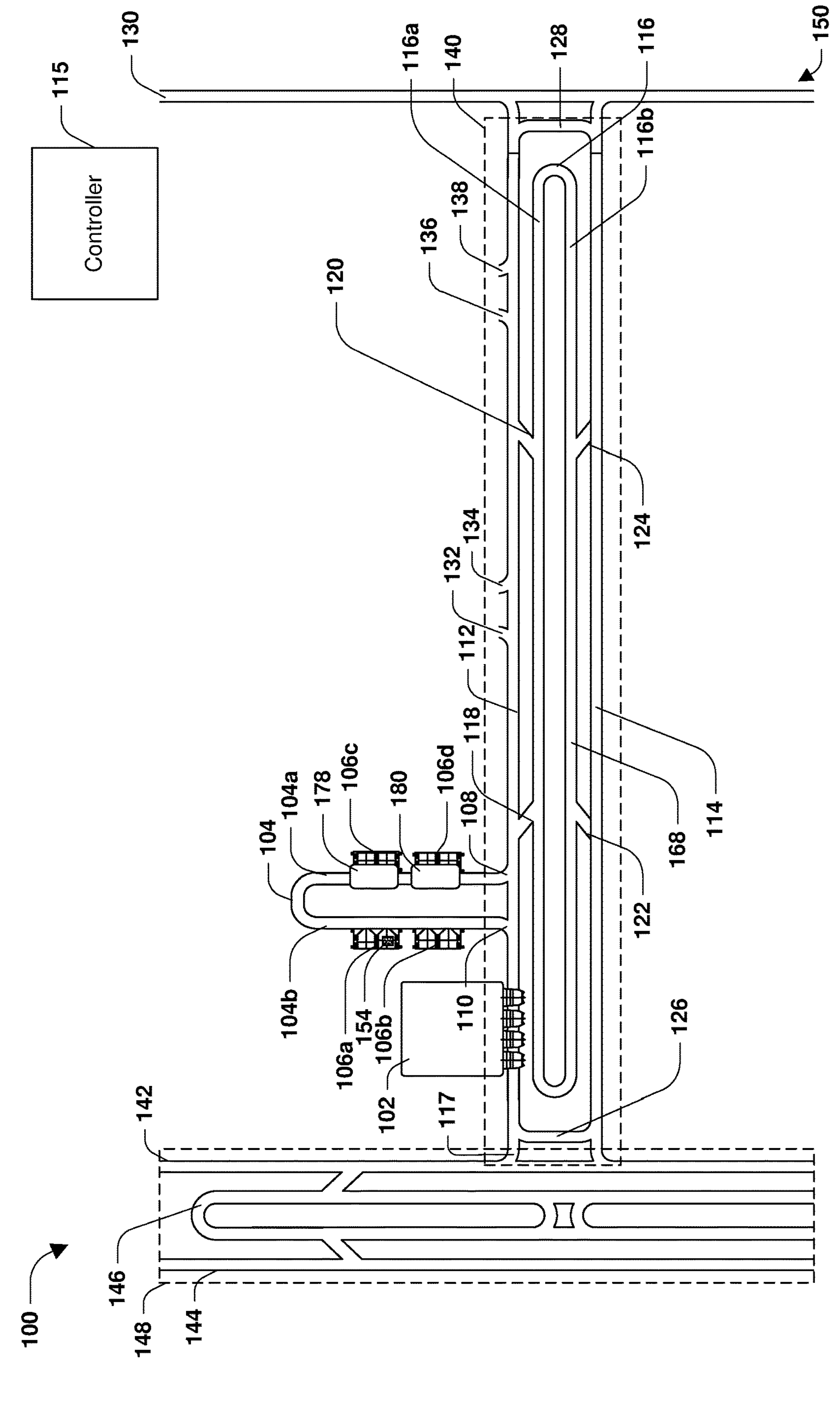
FIG. 1D illustrates a top view of an automated material handling system, in accordance with some embodiments.

In some embodiments, after transferring 172 the first carrier 154 from the first carrier support component 208 of the first transport vehicle 152 to the first buffer support component 106*a*, the first transport vehicle 152 leaves the second track 104. In some embodiments, the first transport vehicle 152 leaves the second track 104 via the second junction 110. In some embodiments, the first transport vehicle 152 leaves the second track 104 to perform the first transport operation. FIG. 1D illustrates the automated material handling system 100 after the first transport vehicle 152 leaves the second track 104, according to some embodiments. In some embodiments, a second transport vehicle 178 of the automated material handling system 100 is at a third location of the second track 104. In some embodiments, the third location is proximal the third buffer support component 106*c*. In some embodiments, a third transport vehicle 180 of the automated material handling system 100 is at a fourth location of the second track 104. In some embodiments, the fourth location is proximal the fourth buffer support component 106*d*. In some embodiments, at least one of the second transport vehicle 178 or the third transport vehicle 180 is a standby vehicle configured to deliver a buffered carrier stored by a buffer support component of the one or more first buffer support components to the first processing station 102 responsive to the first processing station 102 being available to receive the buffered carrier.

Figure 1E:
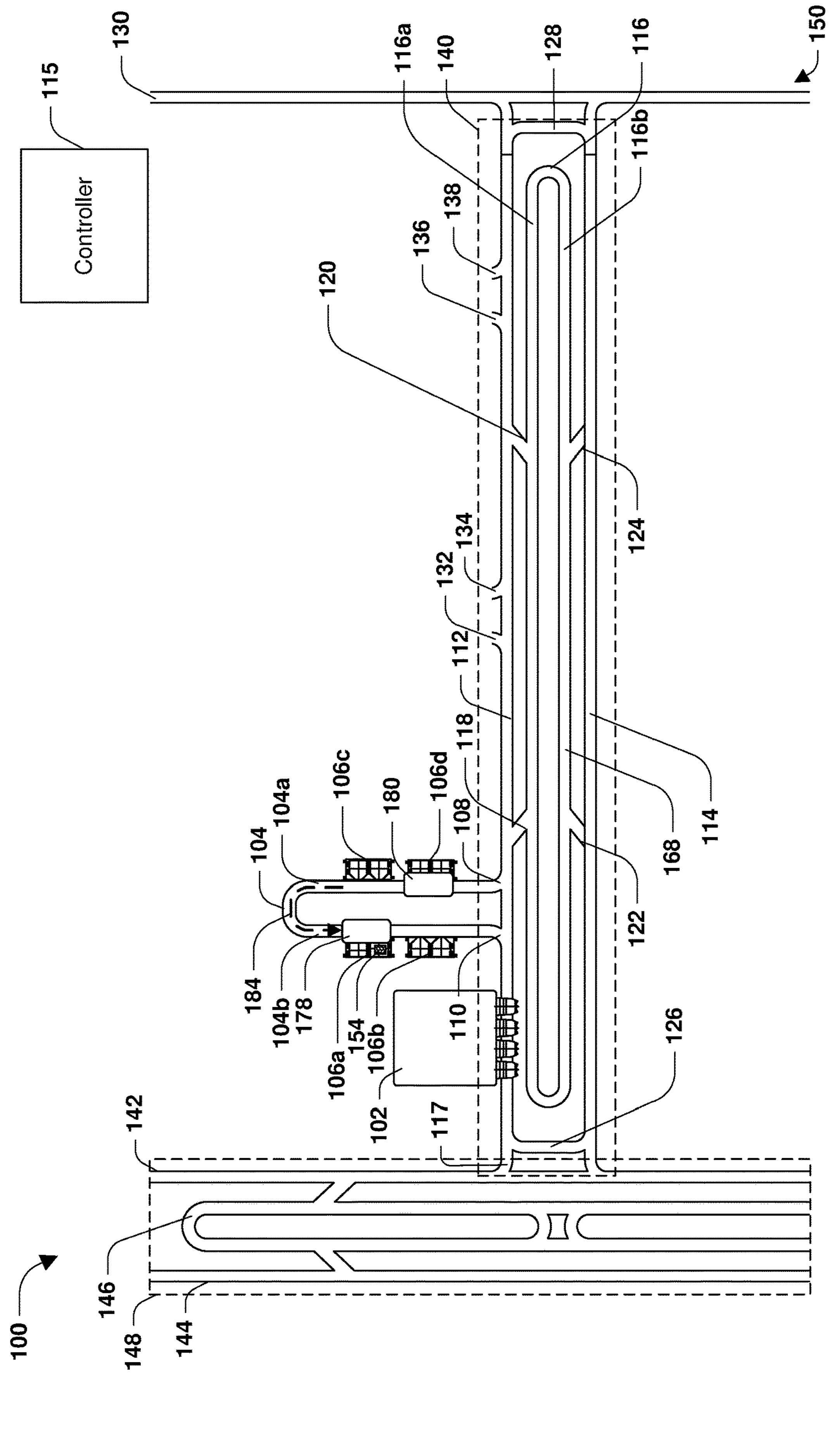
FIG. 1E illustrates a top view of an automated material handling system, in accordance with some embodiments.

FIG. 1E illustrates a second movement operation of the second transport vehicle 178, according to some embodiments. In some embodiments, the second movement operation comprises movement of the second transport vehicle 178 along a second travel path 184. In some embodiments, in the second movement operation, the second transport vehicle 178 travels from the third location of the second track 104 to a fifth location of the second track 104. In some embodiments, the fifth location of the second track 104 is about the same as the second location of the second track 104. In some embodiments, the second transport vehicle 178 travels to the fifth location of the second track 104 responsive to the first processing station 102 being available to receive the first semiconductor wafer 204. In some embodiments, the controller 115 instructs the second transport vehicle 178 to travel to the fifth location of the second track 104 responsive to the first processing station 102 being available to receive the first semiconductor wafer 204.

Embodiments are contemplated in which the second transport vehicle 178 travels from a location different than the third location to the fifth location of the second track 104.

Figure 1F:
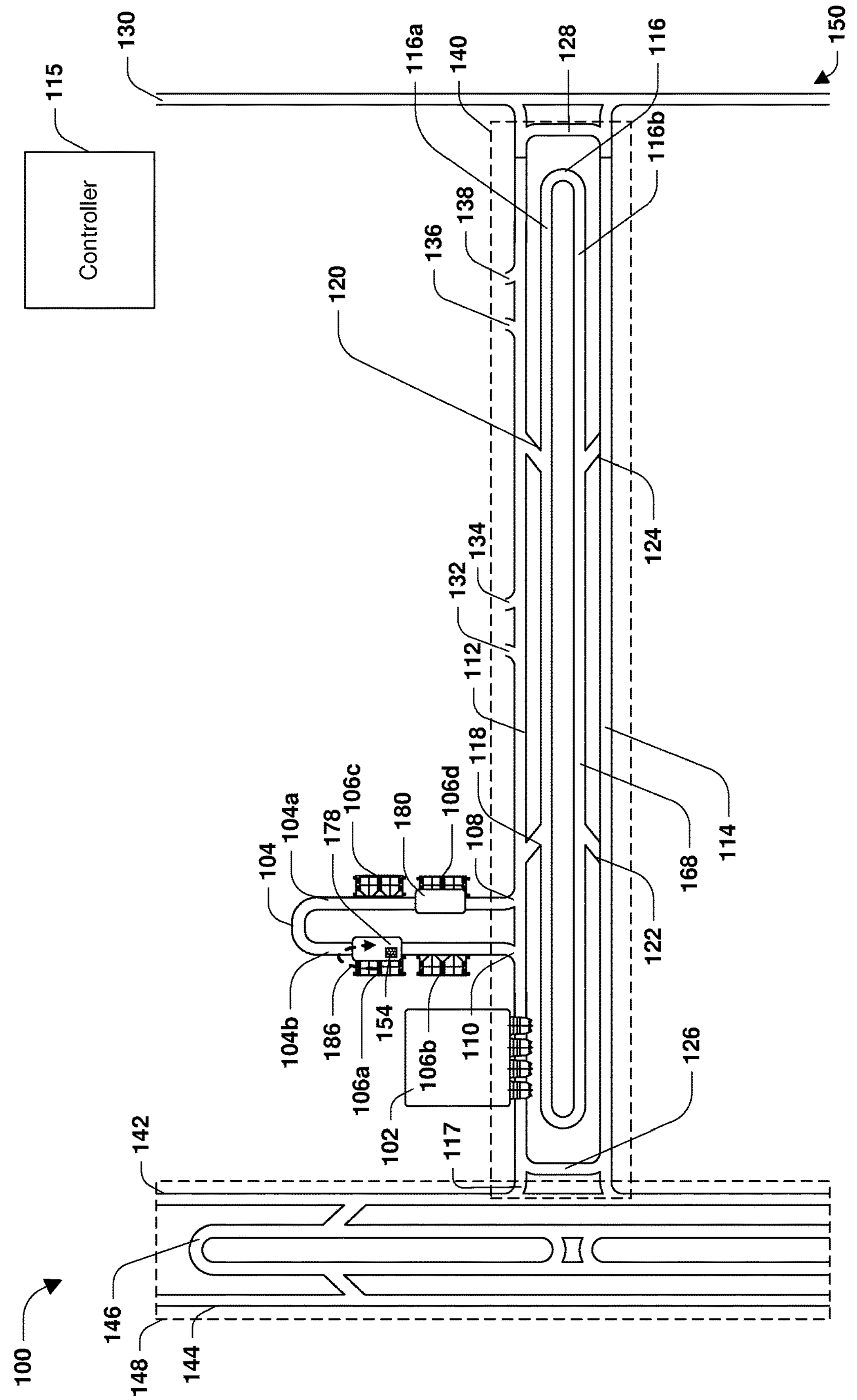
FIG. 1F illustrates a top view of an automated material handling system, in accordance with some embodiments.

FIG. 1F illustrates transfer 186 of the first carrier 154 from the first buffer support component 106*a* to the second transport vehicle 178, according to some embodiments. In some embodiments, the first carrier 154 is transferred 186 from the first buffer support component 106*a* to the second transport vehicle 178 responsive to the second transport vehicle 178 reaching the fifth location of the second track 104. In some embodiments, the fifth location of the second track 104 is proximal the first buffer support component 106*a*. In some embodiments, the first carrier 154 is transferred 186 from the first buffer support component 106*a* to the second transport vehicle 178 while the second transport vehicle 178 is engaged with the second track 104, such as while one or more wheels of the second transport vehicle 178 are at least one of connected to, in direct contact with, or in indirect contact with the second track 104. In some embodiments, the second transport vehicle 178 comprises a second carrier support component (not shown). In some embodiments, the second carrier support component comprises at least one of a belt and pulley system, a robotic arm, a base, or other suitable component. In some embodiments, the second carrier support component selectively engages the first carrier 154. In some embodiments, the first carrier 154 is transferred 186 from the first buffer support component 106*a* to the second transport vehicle 178 using the second carrier support component.

Figure 1G:
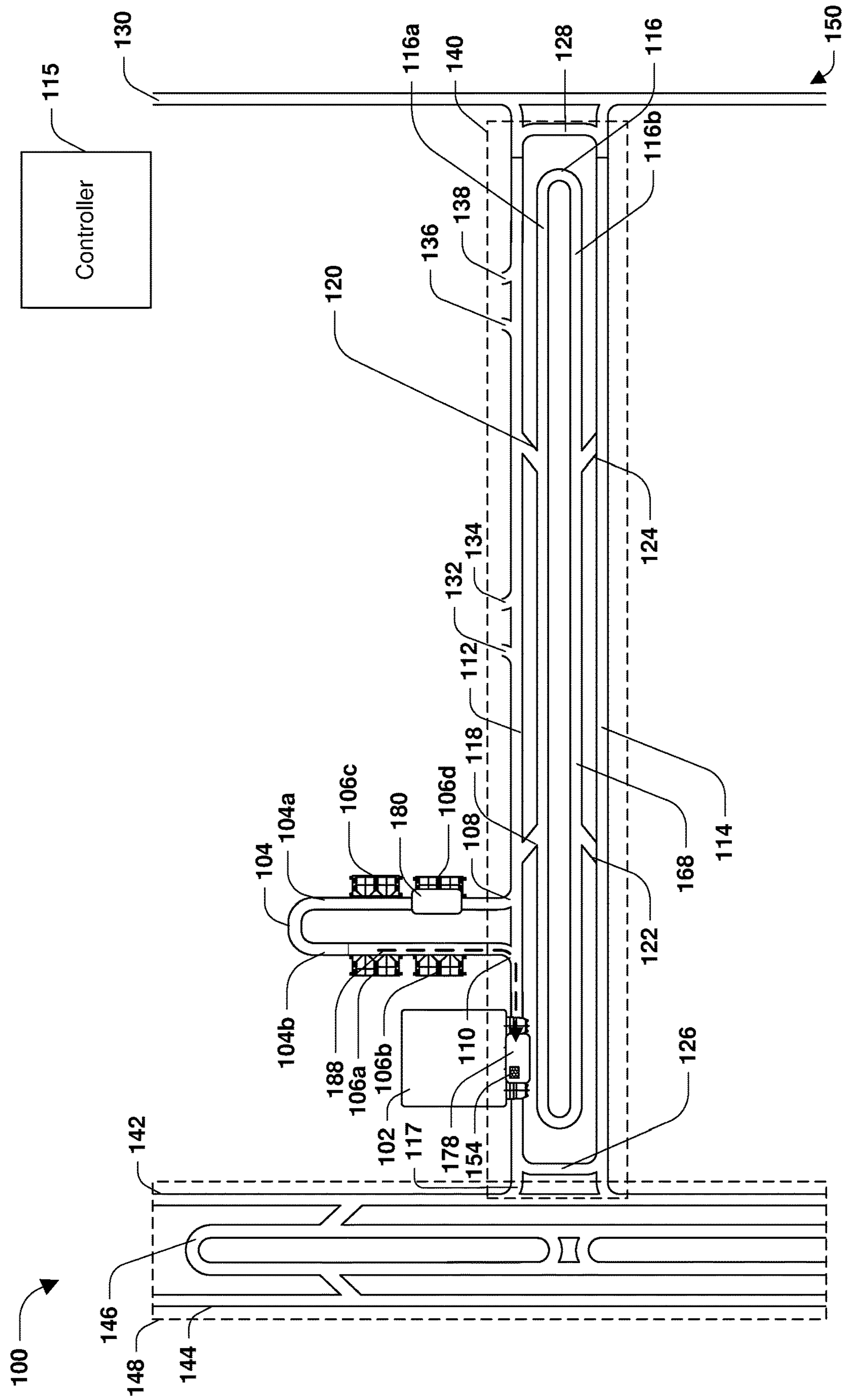
FIG. 1G illustrates a top view of an automated material handling system, in accordance with some embodiments.

FIG. 1G illustrates a third movement operation of the second transport vehicle 178, according to some embodiments. In some embodiments, the third movement operation comprises movement of the second transport vehicle 178 along a third travel path 188. In some embodiments, in the third movement operation, the second transport vehicle 178 travels from the fifth location of the second track 104 to a sixth location of the first track 112. In some embodiments, the second transport vehicle 178 travels from the fifth location of the second track 104 to the sixth location of the first track 112 responsive to at least one of the transfer 186 of the first carrier 154 from the first buffer support component 106*a* to the second transport vehicle 178 or the first processing station 102 being available to receive the first semiconductor wafer 204. In some embodiments, the controller 115 instructs the second transport vehicle 178 to travel to the sixth location of the first track 112 responsive to at least one of the transfer 186 of the first carrier 154 from the first buffer support component 106*a* to the second transport vehicle 178 or the first processing station 102 being available to receive the first semiconductor wafer 204. In some embodiments, the second transport vehicle 178 travels from the second track 104 to the first track 112 via the second junction 110. In some embodiments, the controller 115 controls the second transfer component of the second junction 110 to facilitate transfer of the second transport vehicle 178 from traveling along the second track 104 to traveling along the first track 112.

Figure 1H:
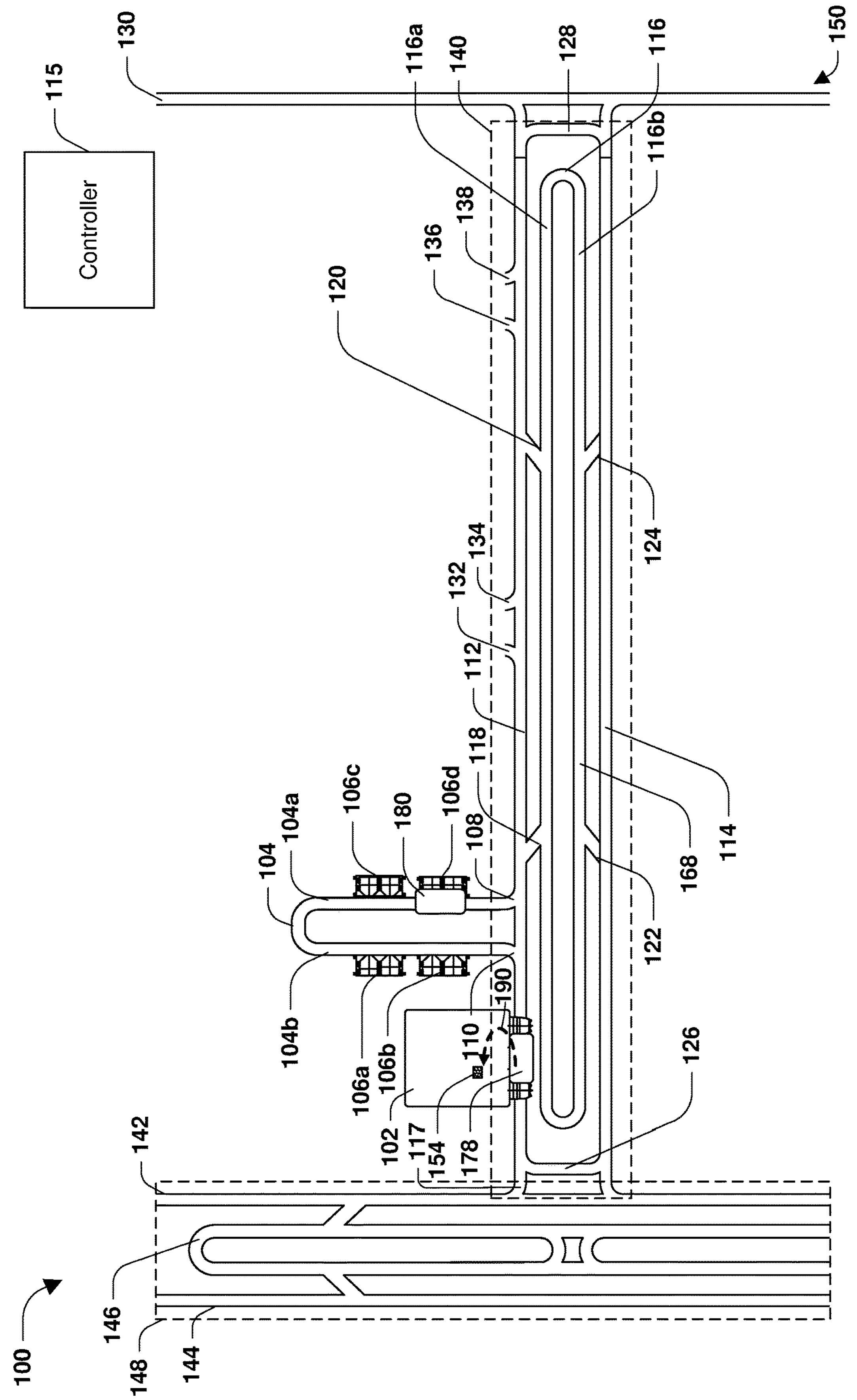
FIG. 1H illustrates a top view of an automated material handling system, in accordance with some embodiments.

FIG. 1H illustrates transfer 190 of the first carrier 154 from the second transport vehicle 178 to the first processing station 102, according to some embodiments. In some embodiments, the first carrier 154 is transferred 190 from the second carrier support component of the second transport vehicle 178 to the first processing station 102 responsive to the second transport vehicle 178 reaching the sixth location of the first track 112. In some embodiments, the sixth location of the first track 112 is proximal the first processing station 102. In some embodiments, the first carrier 154 is transferred 190 from the second carrier support component of the second transport vehicle 178 to the first processing station 102 while the second transport vehicle 178 is engaged with the first track 112, such as while one or more wheels of the second transport vehicle 178 are at least one of connected to, in direct contact with, or in indirect contact with the first track 112. In some embodiments, the first carrier 154 is transferred 190 from the second carrier support component of the second transport vehicle 178 to the first processing station 102 using at least one of the second carrier support component of the second transport vehicle 178, a second mechanical device (not shown), or other suitable component. In some embodiments, the second transport vehicle 178 comprises the second mechanical device. In some embodiments, the second transport vehicle 178 does not comprise the second mechanical device. In some embodiments, the first processing station 102 comprises the second mechanical device. In some embodiments, the controller 115 controls operation of the second mechanical device. In some embodiments, the second carrier support component of the second transport vehicle 178 disengages with the first carrier 154 to release the first carrier 154. In some embodiments, the first processing station 102 comprises a first load port (not shown). In some embodiments, the first carrier 154 is set upon the first load port using at least one of the second carrier support component of the second transport vehicle 178 or the second mechanical device.

In some embodiments, the first semiconductor wafer 204 is transferred from the first carrier 154 into the first processing station 102 via the first load port of the first processing station 102. In some embodiments, the first semiconductor wafer 204 is transferred from the first carrier 154 into the first processing station 102 responsive to transferring 190 the first carrier 154 from the second transport vehicle 178 to the first processing station 102. In some embodiments, when the first carrier 154 is docked onto the first load port, the first semiconductor wafer 204 is unloaded from the first carrier 154 and inserted into the first processing station 102. In some embodiments, after inserting the first semiconductor wafer 204 into the first processing station 102, the first processing station 102 is used to perform the first process on the first semiconductor wafer 204 to produce a first processed semiconductor wafer. In some embodiments, the first process comprises a cleaning process, and the first processed semiconductor wafer comprises a cleaned semiconductor wafer produced by performing the cleaning process on the first semiconductor wafer 204. Other types of processes of the first process are within the scope of the present disclosure. In some embodiments, the first process comprises at least one of a PVD process, a plating process, an etching process, a lithography process, a CMP process, a CVD process, a thermal process, or other process. In some embodiments, responsive to performing the first process on the first semiconductor wafer 204 to produce the first processed semiconductor wafer, the first processed semiconductor wafer is removed from the first processing station 102 and loaded into the first carrier 154, such as the wafer storage device. In some embodiments, multiple semiconductor wafers are processed using the first processing station 102 at a time. In some embodiments, a single semiconductor wafer is processed using the first processing station 102 at a time. In some embodiments, the first processing station 102 is used to perform the first process on each semiconductor wafer of one, some or all semiconductor wafers stored in the first carrier 154 to produce a set of one or more processed semiconductor wafers, and the set of one or more processed semiconductor wafers are loaded into the first carrier 154. In some embodiments, the set of one or more processed semiconductor wafers comprises the first processed semiconductor wafer.

In some embodiments, after transferring 190 the first carrier 154 from the second transport vehicle 178 to the first processing station 102, the second transport vehicle 178 is available to perform a second transport operation for transporting a second carrier (not shown) different than the first carrier 154. In some embodiments, responsive to transferring 190 the first carrier 154 from the second transport vehicle 178 to the first processing station 102, the second transport vehicle 178 travels from the sixth location of the first track 112 to a different location. In some embodiments, responsive to transferring 190 the first carrier 154 from the second transport vehicle 178 to the first processing station 102, the controller 115 instructs the second transport vehicle 178 to perform the second transport operation for transporting the second carrier. In some embodiments, responsive to transferring 190 the first carrier 154 from the second transport vehicle 178 to the first processing station 102, the controller 115 changes a state of the second transport vehicle 178 from occupied state to available state. In some embodiments, when the second transport vehicle 178 is in the available state, the controller 115 includes the second transport vehicle 178 in the list of available transport vehicles. In some embodiments, responsive to identifying the second transport operation associated with transporting the second carrier, the controller 115 selects the second transport vehicle 178 from the list of available transport vehicles to perform the second transport operation. In some embodiments, the controller 115 instructs the second transport vehicle 178 to perform the second transport operation responsive to selecting the second transport vehicle 178. In some embodiments, after transferring 190 the first carrier 154 from the second transport vehicle 178 to the first processing station 102, the second transport vehicle 178 leaves the first track 112. In some embodiments, the second transport vehicle 178 leaves the first track 112 to perform the second transport operation.

Figure 1I:
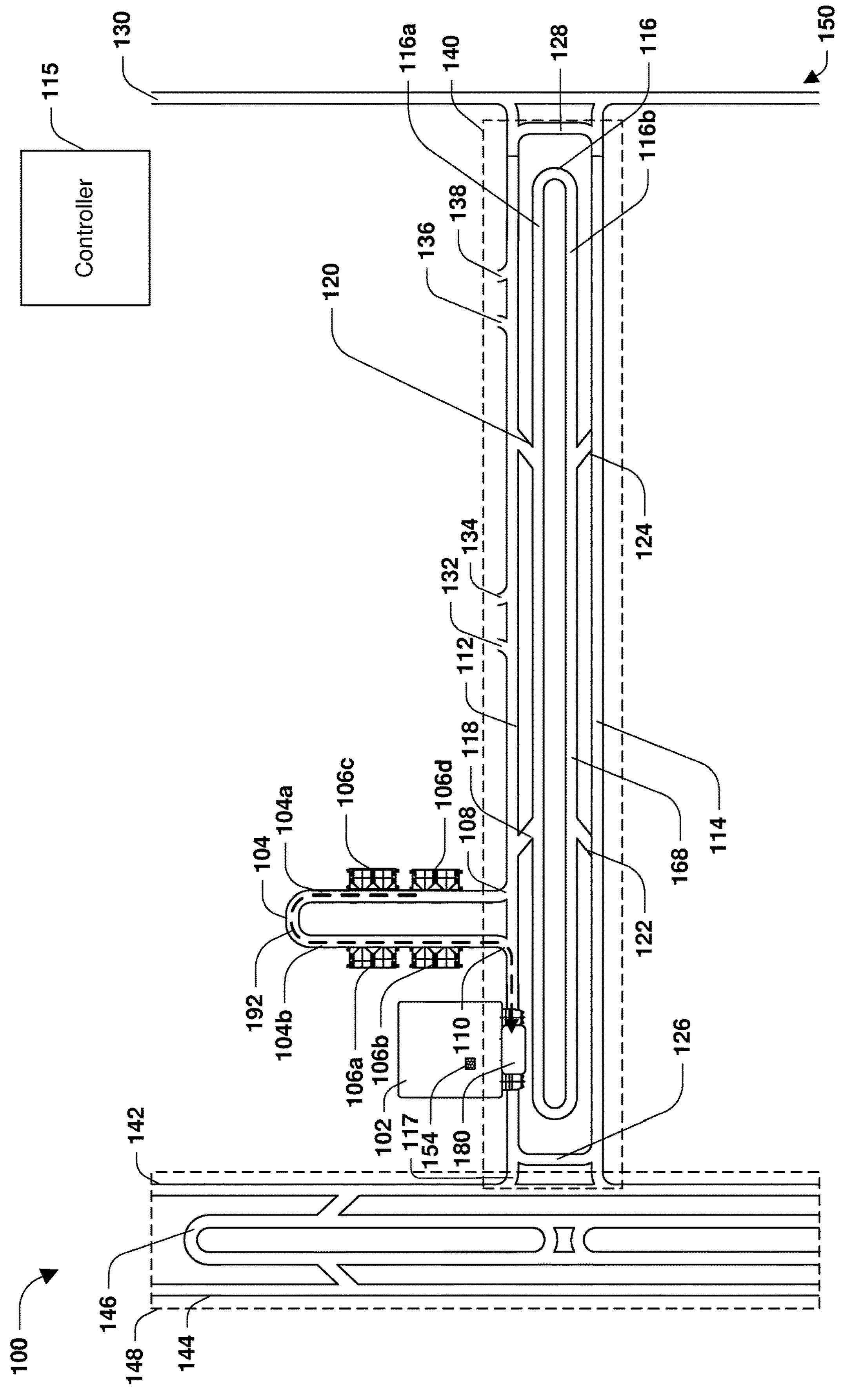
FIG. 1I illustrates a top view of an automated material handling system, in accordance with some embodiments.

FIG. 1I illustrates a fourth movement operation of the third transport vehicle 180, according to some embodiments. In some embodiments, the fourth movement operation comprises movement of the third transport vehicle 180 along a fourth travel path 192. In some embodiments, in the fourth movement operation, the third transport vehicle 180 travels from the fourth location of the second track 104 to a seventh location of the first track 112. In some embodiments, the seventh location of the first track 112 is about the same as the sixth location of the first track 112. In some embodiments, the third transport vehicle 180 travels to the seventh location of the first track 112 responsive to at least one of the first processing station 102 using the first semiconductor wafer 204 to produce the first processed semiconductor wafer, or the first processed semiconductor wafer being loaded into the first carrier 154. In some embodiments, the third transport vehicle 180 travels to the seventh location of the first track 112 responsive to an indication that the first process performed by the first processing station 102 is complete. In some embodiments, the controller 115 instructs the third transport vehicle 180 to travel to the seventh location of the first track 112. Embodiments are contemplated in which the third transport vehicle 180 travels from a location different than the fourth location of the second track 104 to the seventh location of the first track 112. In some embodiments, the third transport vehicle 180 travels from the second track 104 to the first track 112 via the second junction 110. In some embodiments, the controller 115 controls the second transfer component of the second junction 110 to facilitate transfer of the third transport vehicle 180 from traveling along the second track 104 to traveling along the first track 112.

Figure 1J:
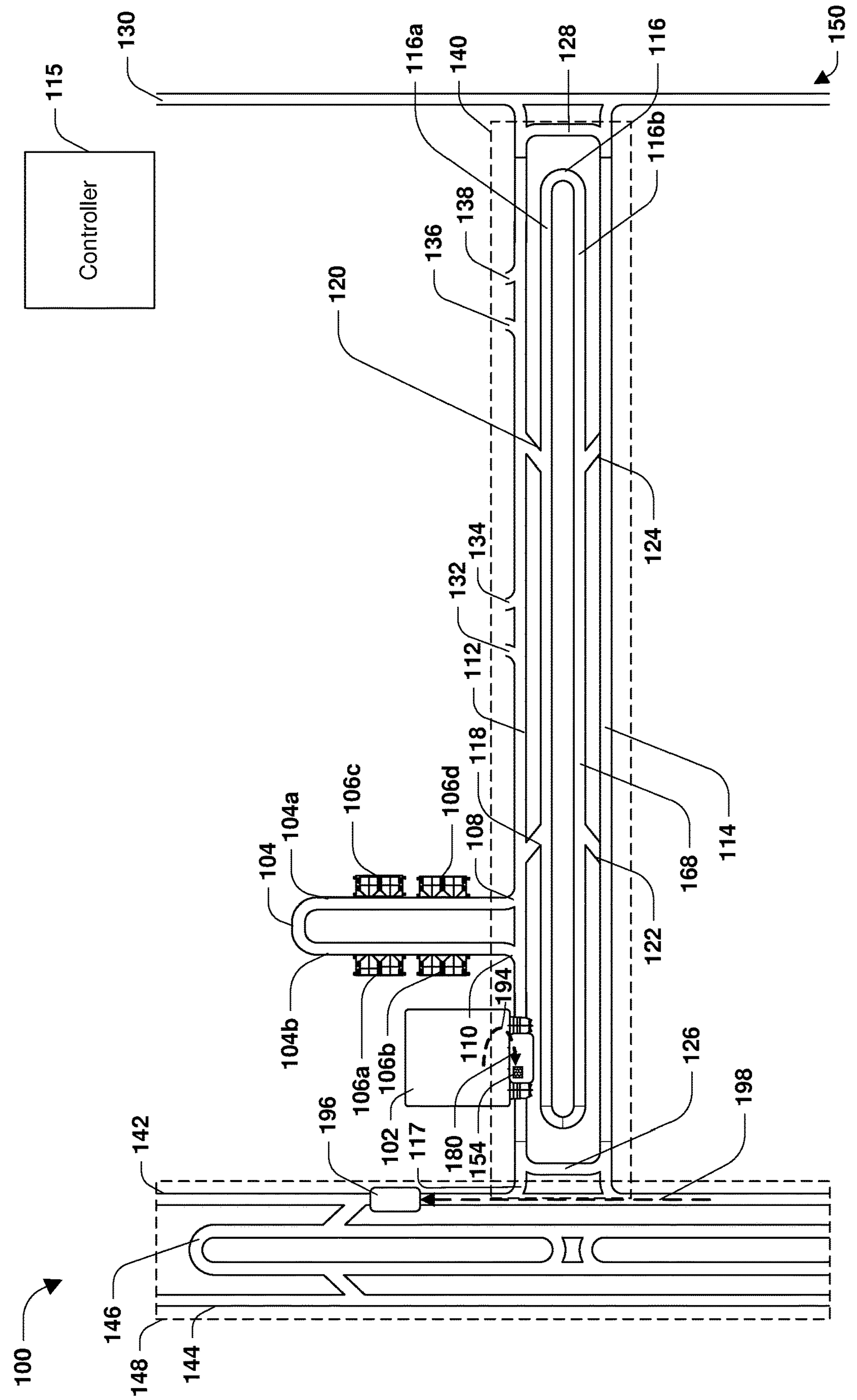
FIG. 1J illustrates a top view of an automated material handling system, in accordance with some embodiments.

FIG. 1J illustrates transfer 194 of the first carrier 154 from the first processing station 102 to the third transport vehicle 180, according to some embodiments. In some embodiments, the first carrier 154 is transferred 194 from the first processing station 102 to the third transport vehicle 180 responsive to at least one of the third transport vehicle 180 reaching the seventh location of the first track 112 the first processing station 102 using the first semiconductor wafer 204 to produce the first processed semiconductor wafer, or the first processed semiconductor wafer being loaded into the first carrier 154. In some embodiments, the seventh location of the first track 112 is proximal the first processing station 102. In some embodiments, the first carrier 154 is transferred 194 from the first processing station 102 to the third transport vehicle 180 while the first carrier 154 carries at least one of the first processed semiconductor wafer or the set of one or more processed semiconductor wafers comprising the first processed semiconductor wafer. In some embodiments, the first carrier 154 is transferred 194 from the first processing station 102 to the third transport vehicle 180 while the third transport vehicle 180 is engaged with the first track 112, such as while one or more wheels of the third transport vehicle 180 are at least one of connected to, in direct contact with, or in indirect contact with the first track 112. In some embodiments, the third transport vehicle 180 comprises a third carrier support component (not shown). In some embodiments, the third carrier support component comprises at least one of a belt and pulley system, a robotic arm, a base, or other suitable component. In some embodiments, the third carrier support component selectively engages the first carrier 154. In some embodiments, the first carrier 154 is transferred 194 from the first processing station 102 to the third transport vehicle 180 using the third carrier support component. In some embodiments, the first carrier 154 is transferred 194 from the first processing station 102 to the third transport vehicle 180 via a first transfer operation. In some embodiments, the third transport vehicle 180 receives the first carrier 154 via the first transfer operation. In some embodiments, in the first transfer operation, the third carrier support component of the third transport vehicle 180 engages the first carrier 154.

Figure 1K:
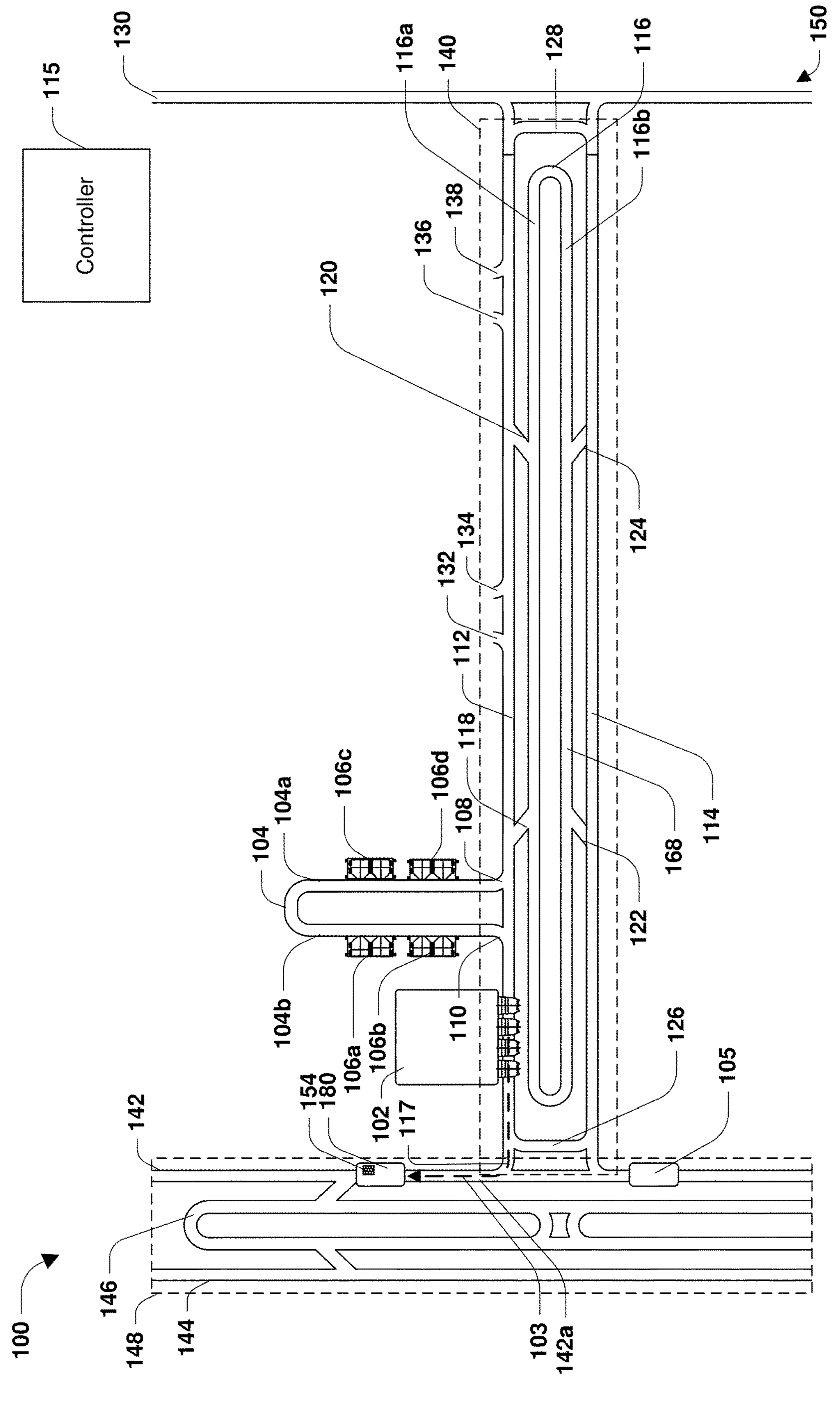
FIG. 1K illustrates a top view of an automated material handling system, in accordance with some embodiments.

FIG. 1K illustrates a fifth movement operation of the third transport vehicle 180, according to some embodiments. In some embodiments, the fifth movement operation comprises movement of the third transport vehicle 180 along a fifth travel path 103. In some embodiments, in the fifth movement operation, the third transport vehicle 180 travels from the seventh location of the first track 112 to an eighth location of the eighth track 142. In some embodiments, the third transport vehicle 180 travels from the seventh location of the first track 112 to the eighth location of the eighth track 142 responsive to the first carrier 154 being transferred 194 from the first processing station 102 to the third transport vehicle 180. In some embodiments, the third transport vehicle 180 travels from the seventh location of the first track 112 to the eighth location of the eighth track 142 responsive to completion of the first transfer operation. In some embodiments, the controller 115 instructs the third transport vehicle 180 to travel to the eighth location of the eighth track 142 responsive to the first carrier 154 being transferred 194 from the first processing station 102 to the third transport vehicle 180. In some embodiments, the third transport vehicle 180 travels from the first track 112 to the eighth track 142 via a seventh junction 117 connecting the first track 112 to the eighth track 142. In some embodiments, the seventh junction 117 comprises a seventh transfer component (not shown), such as at least one of a switch, a turnout, etc., that facilitates transfer of a transport vehicle traveling along the first track 112 to traveling along the eighth track 142. In some embodiments, the controller 115 controls the seventh transfer component of the second junction 110 to facilitate transfer of the third transport vehicle 180 from traveling along the first track 112 to traveling along the eighth track 142.

In some embodiments, a junction management controller is configured to manage movement of transport vehicles along the eighth track 142. In some embodiments, the controller 115 comprises the junction management controller. In some embodiments, the first processing station 102 comprises the junction management controller. In some embodiments, the junction management controller is configured to manage movement of transport vehicles along a first portion 142*a*, of the eighth track 142, to which the first track 112 is connected via the seventh junction 117. In some embodiments, the third transport vehicle 180 travels along the first portion 142*a* of the eighth track 142 in the fifth movement operation.

In some embodiments, the junction management controller is configured to manage movement of transport vehicles along the eighth track 142 based upon the first transfer operation. In some embodiments, the junction management controller allows one or more first transport vehicles of the automated material handling system 100 to travel along the first portion 142*a* of the eighth track 142 while the first carrier 154 is received using the third carrier support component. In some embodiments, the junction management controller allows the one or more first transport vehicles to travel along the first portion 142*a* of the eighth track 142 based upon the first transfer operation being underway and/or incomplete. In some embodiments, the junction management controller allows the one or more first transport vehicles to travel along the first portion 142*a* of the eighth track 142 while the first transfer operation is performed using at least one of the third transport vehicle 180 or the first processing station 102.

Referring back to FIG. 1J, in some embodiments, the junction management controller allows a fourth transport vehicle 196 of the automated material handling system 100 to travel along the first portion 142*a* of the eighth track 142 while the first carrier 154 is received using the third carrier support component. In some embodiments, the junction management controller allows the fourth transport vehicle 196 to travel along the first portion 142*a* of the eighth track 142, such as along a travel path 198, based upon the first transfer operation being underway and/or incomplete. In some embodiments, the junction management controller allows the fourth transport vehicle 196 to travel along the first portion 142*a* of the eighth track 142 while the first transfer operation is performed using at least one of the third transport vehicle 180 or the first processing station 102. In some embodiments, during the first transfer operation, the junction management controller allows the fourth transport vehicle 196 to travel along the first portion 142*a* of the eighth track 142 regardless of whether a priority associated with the fourth transport vehicle 196 is greater than a first priority associated with at least one of the third transport vehicle 180 or the first carrier 154 transported using the third transport vehicle 180.

In some embodiments, the junction management controller blocks one or more second transport vehicles of the automated material handling system 100 from traveling along the first portion 142*a* of the eighth track 142 responsive to the first carrier 154 being received using the third carrier support component. In some embodiments, the junction management controller blocks the one or more second transport vehicles from traveling along the first portion 142*a* of the eighth track 142 based upon the first transfer operation being complete. In some embodiments, the junction management controller blocks the one or more second transport vehicles from traveling along the first portion 142*a* of the eighth track 142 responsive to completing the first transfer operation. In some embodiments, the junction management controller blocks the one or more second transport vehicles from traveling along the first portion 142*a* of the eighth track 142 during the fifth movement operation to allow the third transport vehicle 180 to travel from the first track 112 to the eighth track 142 via the seventh junction 117.

Referring back to FIG. 1K, in some embodiments, the junction management controller blocks a fifth transport vehicle 105 of the automated material handling system 100 from traveling along the first portion 142*a* of the eighth track 142 while the first carrier 154 is received using the third carrier support component. In some embodiments, the junction management controller blocks the fifth transport vehicle 105 from traveling along the first portion 142*a* of the eighth track 142 based upon the first transfer operation being complete. In some embodiments, the junction management controller blocks the fifth transport vehicle 105 from traveling along the first portion 142*a* of the eighth track 142 responsive to completing the first transfer operation. In some embodiments, the junction management controller blocks the fifth transport vehicle 105 from traveling along the first portion 142*a* of the eighth track 142 during the fifth movement operation to allow the third transport vehicle 180 to travel from the first track 112 to the eighth track 142 via the seventh junction 117.

In some embodiments, the junction management controller blocks the fifth transport vehicle 105 from traveling along the first portion 142*a* of the eighth track 142 based upon the first priority associated with at least one of the third transport vehicle 180 or the first carrier 154 transported using the third transport vehicle 180 being greater than a second priority associated with at least one of the fifth transport vehicle 105 or a carrier (not shown) transported using the fifth transport vehicle 105. In some embodiments, the junction management controller allows the fifth transport vehicle 105 to travel along the first portion 142*a* of the eighth track 142 responsive to the third transport vehicle 180 traveling from the first track 112 to the eighth track 142 via the seventh junction 117 in the fifth movement operation. In some embodiments, the junction management controller allows the fifth transport vehicle 105 to travel along the first portion 142*a* of the eighth track 142 responsive to the third transport vehicle 180 completing the fifth movement operation.

In some embodiments, the first priority is based upon at least one of (i) a scheduled time of a subsequent process scheduled to be performed on a semiconductor wafer, such as the first processed semiconductor wafer, stored in the first carrier 154, (ii) a scheduled production time corresponding to a time at which fabrication of the semiconductor wafer stored in the first carrier 154 is scheduled to be completed, (iii) a delivery time requirement corresponding to a duration of time within which the first carrier is required to be delivered to a processing station, a stocking location, or other location, (iv) a sensitivity of the first processed semiconductor wafer stored in the first carrier 154, (v) a priority value assigned to at least one of the first carrier 154 or the first processed semiconductor wafer stored in the first carrier 154, (vi) the scheduled production time, or (vii) other suitable information.

Figure 1L:
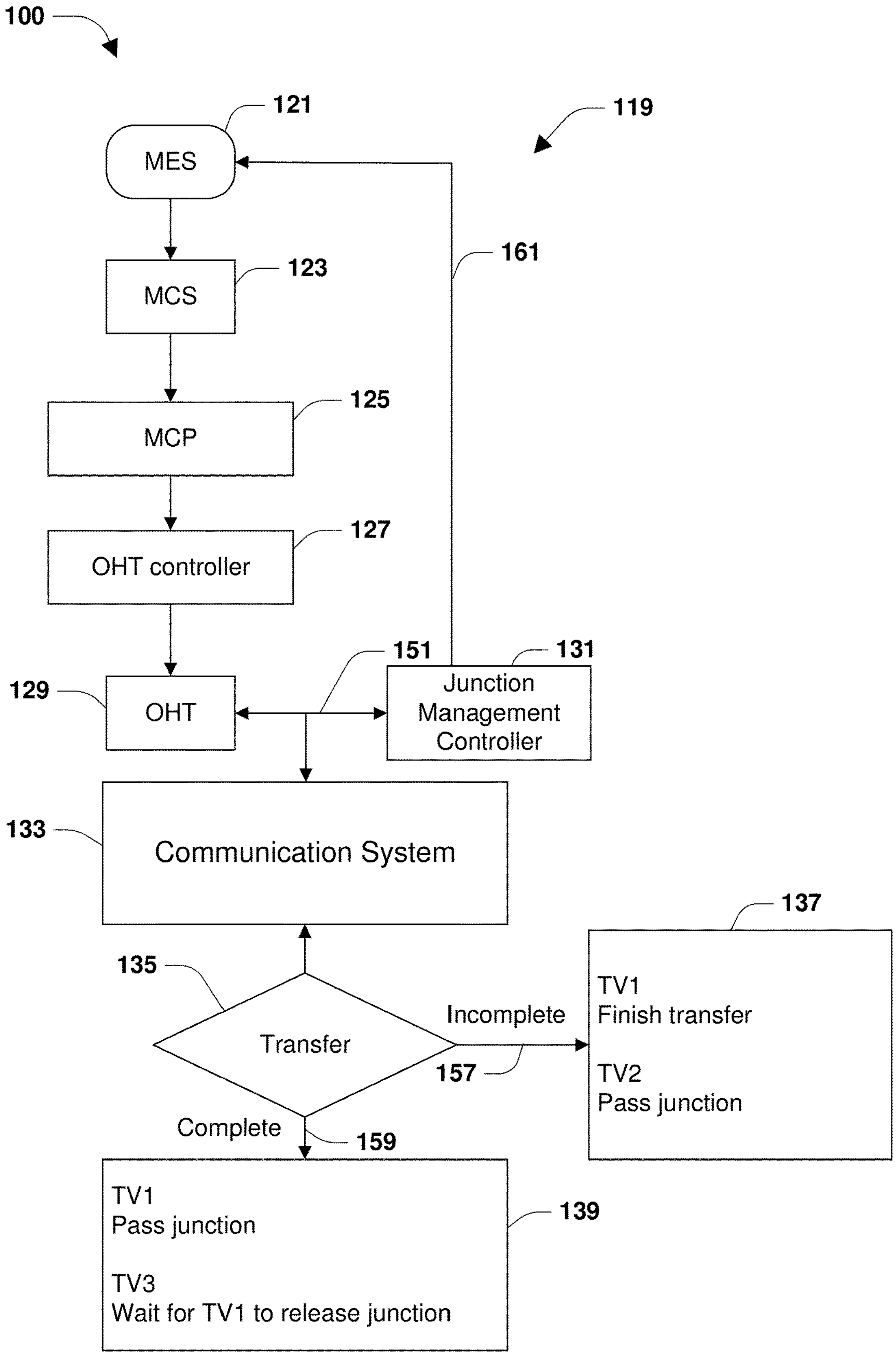
FIG. 1L illustrates a component block diagram showing communication between one or more components of an automated material handling system, in accordance with some embodiments.

FIG. 1L illustrates communication between one or more components of the automated material handling system 100, according to some embodiments. In some embodiments, the automated material handling system 100 at least one of a manufacturing execution system (MES) 121, a material control system (MCS) 123, a material control planner (MCP) 125, a transportation controller 127 such as an overhead hoist transport (OHT) controller, one or more transport vehicles 129 such as one or more OHT vehicles, the junction management controller (shown with reference number 131), or a communication system 133. In some embodiments, the controller 115 comprises the junction management controller 131. In some embodiments, the first processing station 102 comprises the junction management controller 131. In some embodiments, the communication system 133 comprises at least one of a wired communication system, a wireless communication system, a Bluetooth communication system, a WiFi communication system, an E84 communication system, or other type of communication system. In some embodiments, components of the automated material handling system 100 communicate with each other using the communication system 133. In some embodiments, the junction management controller 131 communicates 151 with the one or more transport vehicles 129 using the communication system 133. In some embodiments, the junction management controller 131 communicates 161 with the MES 121 using at least one of the communication system 133 or other communication system.

In some embodiments, the one or more transport vehicles 129 comprises at least one of a transport vehicle TV1, a transport vehicle TV2, or a transport vehicle TV3. In some embodiments, a transfer operation 135 is performed by the transport vehicle TV1 and the first processing station 102. In some embodiments, the transport vehicle TV2 is at least one of traveling along the eighth track 142, engaged with the eighth track 142, or scheduled to travel along the eighth track 142. In some embodiments, responsive to the transfer operation 135 being incomplete 157, the junction management controller 131 at least one of (i) instructs the transport vehicle TV1 to finish the transfer operation 135, or (ii) instructs the transport vehicle TV2 to travel along the first portion 142*a* of the eighth track 142 associated with the seventh junction 117. In some embodiments, the transport vehicle TV3 is at least one of traveling along the eighth track 142, engaged with the eighth track 142, or scheduled to travel along the eighth track 142. In some embodiments, responsive to the transfer operation 135 being complete 159, the junction management controller 131 at least one of (i) instructs the transport vehicle TV1 to travel along the first portion 142*a* of the eighth track 142 associated with the seventh junction 117, or (ii) instructs the transport vehicle TV3 to at least one of (A) wait for the transport vehicle TV1 to release the seventh junction 117, or (B) travel along the first portion 142*a* of the eighth track 142 associated with the seventh junction 117 after the seventh junction 117 is released by the transport vehicle TV1.

In some embodiments, the transfer operation 135 comprises transferring a carrier from the first processing station 102 to the transport vehicle TV1. In some embodiments, at least one of the transport vehicle TV1 comprises the third transport vehicle 180, the transport vehicle TV2 comprises the fourth transport vehicle 196, or the transport vehicle TV3 comprises the fifth transport vehicle 105. In some embodiments, the transfer operation 135 comprises the transfer 194 (shown in FIG. 1J) of the first carrier 154 from the first processing station 102 to the third transport vehicle 180.

In some embodiments, the transfer operation 135 comprises transferring a carrier from the transport vehicle TV1 to the first processing station 102. In some embodiments, the transport vehicle TV1 comprises the second transport vehicle 178. In some embodiments, the transfer operation 135 comprises the transfer 190 of the first carrier 154 from the second transport vehicle 178 to the first processing station 102. In some embodiments, the junction management controller 131 allows the transport vehicle TV2 to travel along the first portion 142*a* of the eighth track 142 associated with the seventh junction 117 during the transfer 190 of the first carrier 154 from the second transport vehicle 178 to the first processing station 102. In some embodiments, responsive to completing the transfer 190 of the first carrier 154 from the second transport vehicle 178 to the first processing station 102, the junction management controller 131 blocks the transport vehicle TV3 from traveling along the first portion 142*a* of the eighth track 142 associated with the seventh junction 117 to allow the second transport vehicle 178 to travel from the first track 112 to the eighth track 142 via the seventh junction 117.

In some embodiments, the first transport track system 150 comprises one or more track coupling components. In some embodiments, the first track 112 comprises the one or more track coupling components. In some embodiments, the one or more track coupling components comprise a first track coupling component 132, a second track coupling component 134, a third track coupling component 136, a fourth track coupling component 138, or one or more other track coupling components. In some embodiments, a supplemental track is coupled to the first track 112 via the one or more track coupling components. In some embodiments, the supplemental track has one or more of the features, structures, etc. of the second track 104.

Figure 1M:
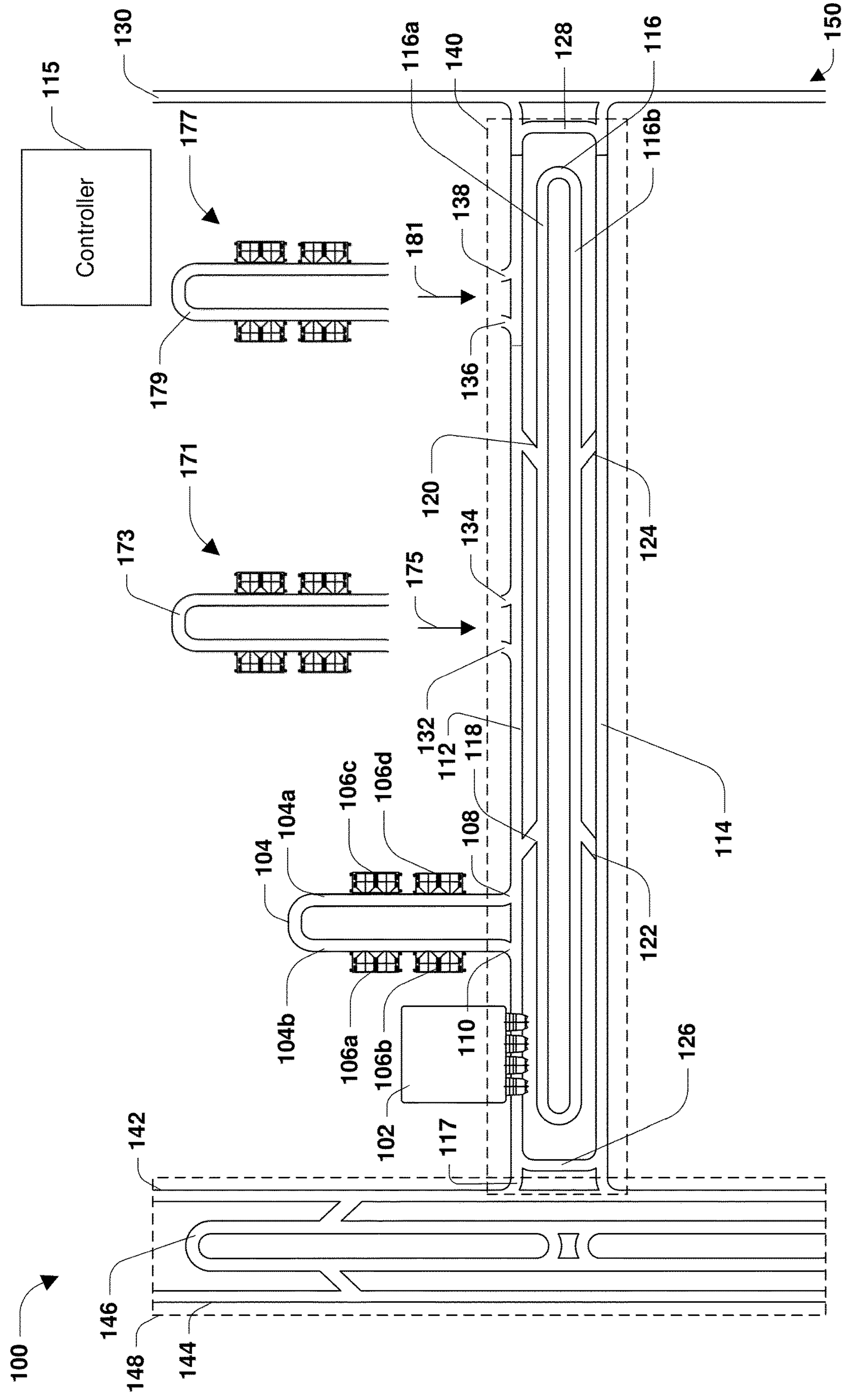
FIG. 1M illustrates a top view of an automated material handling system, in accordance with some embodiments.

FIG. 1M illustrates coupling 175 a first track assembly 171 to the first track 112 via the first track coupling component 132 and the second track coupling component 134, according to some embodiments. In some embodiments, the first track assembly 171 comprises at least one of a first supplemental track 173 or a first set of supplemental buffer support components. In some embodiments, the first supplemental track 173 has one or more of the features, structures, relationships with other elements, etc. provided herein with respect to the second track 104. In some embodiments, the first set of supplemental buffer support components have one or more of the features, structures, relationships with other elements, etc. provided herein with respect to the one or more first buffer support components. In some embodiments, the first supplemental track 173 is attachable to the first track 112 and/or detachable from the first track 112. In some embodiments, the first track assembly 171 is used to service a first supplemental processing station (not shown). In some embodiments, the first supplemental processing station is between the second track 104 and the first supplemental track 173. In some embodiments, the first supplemental track 173 is coupled 175 to the first track 112 responsive to a first equipment change in the semiconductor manufacturing environment. In some embodiments, the first equipment change comprises at least one of adding the first supplemental processing station into the semiconductor manufacturing environment or positioning the first supplemental processing station at a location proximal the first track 112.

In some embodiments, a second track assembly 177 is coupled 181 to the first track 112 via the third track coupling component 136 and the fourth track coupling component 138, according to some embodiments. In some embodiments, the second track assembly 177 comprises at least one of a second supplemental track 179 or a second set of supplemental buffer support components. In some embodiments, the second supplemental track 179 has one or more of the features, structures, relationships with other elements, etc. provided herein with respect to the second track 104. In some embodiments, the second set of supplemental buffer support components have one or more of the features, structures, relationships with other elements, etc. provided herein with respect to the one or more first buffer support components. In some embodiments, the second supplemental track 179 is attachable to the first track 112 and/or detachable from the first track 112. In some embodiments, the second track assembly 177 is used to service a second supplemental processing station (not shown). In some embodiments, the second supplemental processing station is between the first supplemental track 173 and the second supplemental track 179. In some embodiments, the second supplemental track 179 is coupled 181 to the first track 112 responsive to a second equipment change in the semiconductor manufacturing environment. In some embodiments, the second equipment change comprises at least one of adding the second supplemental processing station into the semiconductor manufacturing environment or positioning the second supplemental processing station at a location proximal the first track 112.

In some embodiments, the second track 104 is detachable from the first track 112 and/or attachable to the first track 112 via one or more first track coupling components (not shown) of the one or more track coupling components. In some embodiments, the one or more first track coupling components comprise at least a portion of the first junction 108 or the second junction 110. In some embodiments, the second track 104 is detached from the first track 112 responsive to a third equipment change in the semiconductor manufacturing environment. In some embodiments, the third equipment change comprises at least one of removing the first processing station 102 from the semiconductor manufacturing environment or moving the first processing station 102 to another location of the semiconductor manufacturing environment.

Figure 3:
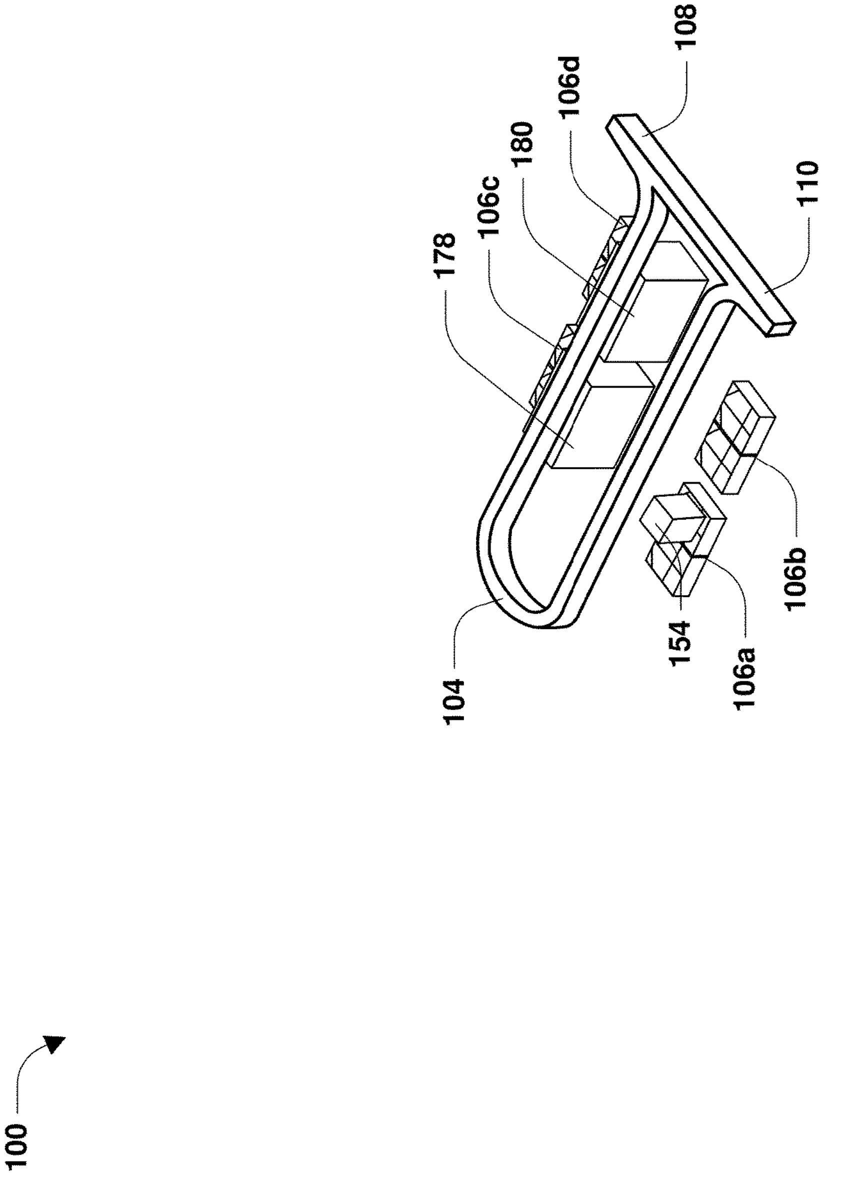
FIG. 3 illustrates a perspective view of a second transport vehicle and a third transport vehicle engaged with a second track, in accordance with some embodiments.

FIG. 3 illustrates a perspective view of the second transport vehicle 178 and the third transport vehicle 180 engaged with the second track 104, according to some embodiments. In some embodiments, at least one of an elevation of the second transport vehicle 178 or an elevation of the third transport vehicle 180 is higher than at least one of an elevation of the first buffer support component 106*a*, an elevation of the second buffer support component 106*b*, an elevation of the third buffer support component 106*c*, or an elevation of the fourth buffer support component 106*d*. In some embodiments, at least one of the elevation of the second transport vehicle 178 or the elevation of the third transport vehicle 180 is about the same as at least one of the elevation of the first buffer support component 106*a*, the elevation of the second buffer support component 106*b*, the elevation of the third buffer support component 106*c*, or the elevation of the fourth buffer support component 106*d*. In some embodiments, at least one of the elevation of the second transport vehicle 178 or the elevation of the third transport vehicle 180 is lower than at least one of the elevation of the first buffer support component 106*a*, the elevation of the second buffer support component 106*b*, the elevation of the third buffer support component 106*c*, or the elevation of the fourth buffer support component 106*d*.

In some embodiments, at least some buffer support components of the automated material handling system 100 have one or more of the features, structures, relationships with other elements, etc. provided herein with respect to the one or more first buffer support components.

Figure 4:
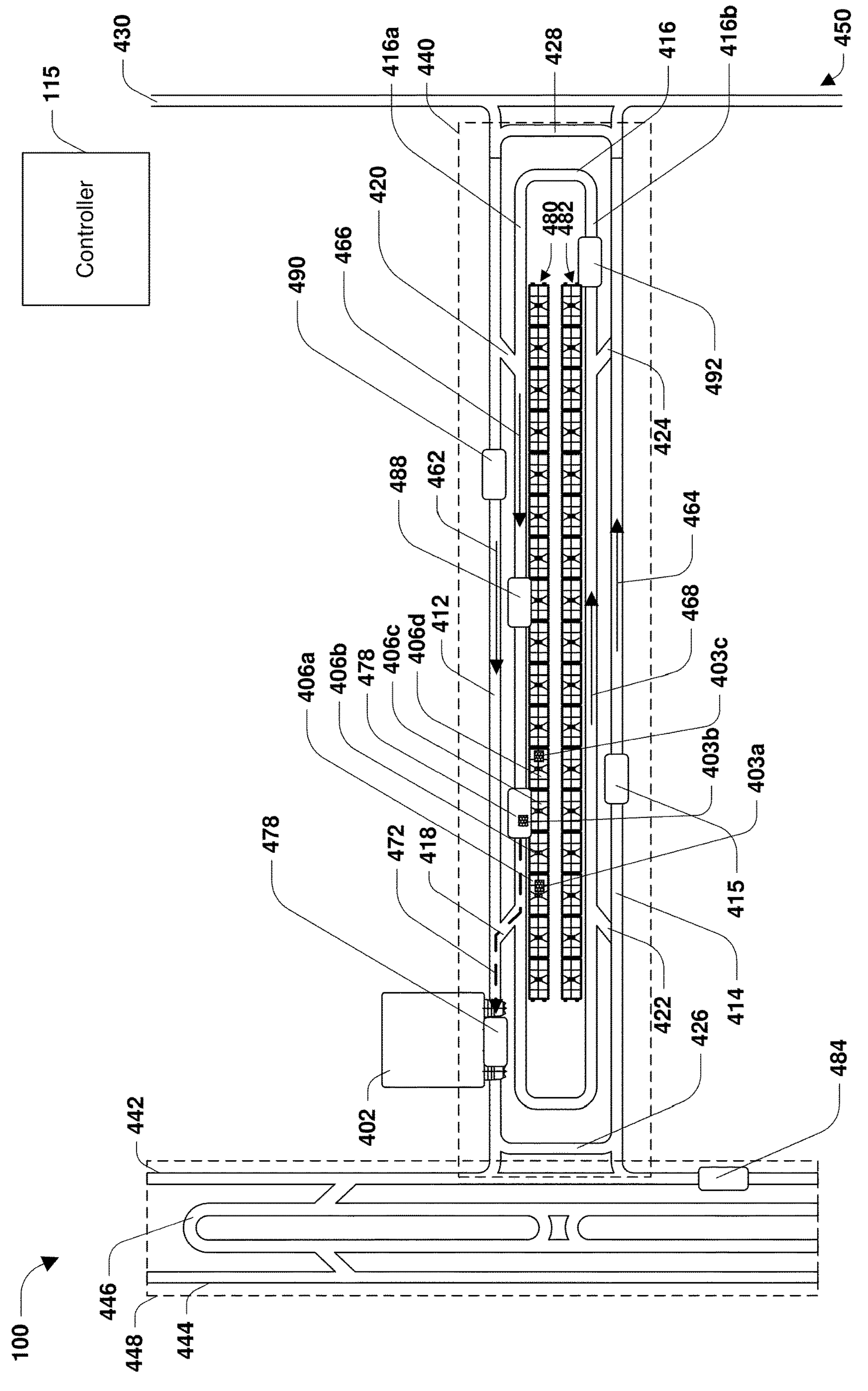
FIG. 4 illustrates a top view of an automated material handling system, in accordance with some embodiments.

FIG. 4 illustrates the automated material handling system 100 with a second transport track system 450, according to some embodiments. In some embodiments, the second transport track system 450 is configured to facilitate movement of a transport vehicle to transport a semiconductor wafer to one or more locations within the semiconductor manufacturing environment. In some embodiments, the controller 115 is configured to manage movement of transport vehicles along one or more tracks of the second transport track system 450. In some embodiments, some or all components shown in and/or discussed with respect to FIG. 4 have some or all features, structures, relationships with other elements, etc. provided herein with respect to FIGS. 1A-1M.

In some embodiments, the semiconductor manufacturing environment comprises a second processing station 402. In some embodiments, the second processing station 402 comprises a semiconductor fabrication station. In some embodiments, the second processing station 402 is configured to perform a process, such as a semiconductor fabrication process, on a semiconductor wafer. In some embodiments, the second processing station 402 comprises at least one of cleaning equipment, PVD equipment, plating equipment, etching equipment, lithography equipment, CMP equipment, CVD equipment, a furnace, or other equipment.

In some embodiments, the second transport track system 450 comprises a second plurality of tracks. In some embodiments, each track of one, some, or all of the second plurality of tracks comprises one or more rails, races, sidewalls, etc. and is configured to accommodate a transport vehicle of the automated material handling system 100. In some embodiments, each track of one, some, or all of the second plurality of tracks comprises at least one of metal, phenolic, nylon, or other suitable material. In some embodiments, at least some of a track of the second plurality of tracks is suspended from a ceiling. In some embodiments, at least some of a track of the second plurality of tracks is erected from at least one of a floor or a wall. In some embodiments, at least some of a track of the second plurality of tracks is erected using a lattice support structure.

In some embodiments, the second plurality of tracks comprises at least one of a first track 412, a second track 416, a third track 414, a fourth track 446, a fifth track 426, a sixth track 428, a seventh track 430, an eighth track 442, a ninth track 444, or one or more other suitable tracks. In some embodiments, the second transport track system 450 comprises a plurality of track system segments. In some embodiments, the plurality of track system segments comprises at least one of a first track system segment 440, a second track system segment 448, or one or more other suitable track system segments. In some embodiments, the first track system segment 440 comprises an intra-bay segment for transporting a carrier from one location within a bay to another location within the (same) bay. In some embodiments, the first track system segment 440 comprises at least one of the first track 412, the second track 416, the third track 414, the fifth track 426, the sixth track 428, or one or more other suitable tracks. In some embodiments, the second track system segment 448 comprises an inter-bay segment for transporting a carrier from a first bay to a second bay different than the first bay. In some embodiments, the second track system segment 148 comprises at least one of the eighth track 442, the ninth track 444, the fourth track 446, or one or more other suitable tracks.

In some embodiments, a transport vehicle of the automated material handling system 100 travels along the first track 412. According to some embodiments, the transport vehicle is maintained on the first track 412 using guide rails, guard rails, etc. In some embodiments, the first track 412 is configured to facilitate movement of a transport vehicle in a first direction 462. In some embodiments, the third track 414 is configured to facilitate movement of a transport vehicle in a second direction 464 different than the first direction 462. In some embodiments, the second direction 464 is opposite the first direction 462.

In some embodiments, the second track 416 is connected to the first track 412 via at least one of a first junction 418 or a second junction 420. In some embodiments, the second track 416 is connected to the third track 414 via at least one of a third junction 422 or a fourth junction 424. In some embodiments, the second track 416 comprises a track loop, such as an inner track loop of the first track system segment 440. In some embodiments, the second track 416 comprises a first portion 416*a* and a second portion 416*b*. In some embodiments, the first portion 416*a* of the second track 416 is substantially parallel to the second portion 416*b* of the second track 416. In some embodiments, the first portion 416*a* of the second track 416 is configured to facilitate movement of a transport vehicle in a third direction 466. In some embodiments, the second portion 416*b* of the second track 416 is configured to facilitate movement of a transport vehicle in a fourth direction 468 different than the third direction 466. In some embodiments, the fourth direction 468 is opposite the third direction 466. In some embodiments, at least one of the third direction 466 or the fourth direction 468 is substantially parallel to at least one of the first direction 462 or the second direction 464. In some embodiments, the first junction 418 comprises a first transfer component (not shown), such as at least one of a switch, a turnout, etc., that facilitates transfer of a transport vehicle traveling along the second track 416 to traveling along the first track 412. In some embodiments, the second junction 420 comprises a second transfer component (not shown), such as at least one of a switch, a turnout, etc., that facilitates transfer of a transport vehicle traveling along the first track 412 to traveling along the second track 416. In some embodiments, the third junction 422 comprises a fifth transfer component (not shown), such as at least one of a switch, a turnout, etc., that facilitates transfer of a transport vehicle traveling along the third track 414 to traveling along the second track 416. In some embodiments, the fourth junction 424 comprises a fourth transfer component (not shown), such as at least one of a switch, a turnout, etc., that facilitates transfer of a transport vehicle traveling along the second track 416 to traveling along the third track 414.

In some embodiments, the automated material handling system 100 comprises one or more second buffer support components comprising at least one of a first buffer support component 406*a*, a second buffer support component 406*b*, a third buffer support component 406*c*, or a fourth buffer support component 406*d*. In some embodiments, the one or more second buffer support components comprise at least one of a first set of buffer support components 480 or a second set of buffer support components 482. In some embodiments, the first set of buffer support components 480 comprises buffer support components, such as a row of buffer support components, that are proximal the first portion 416*a* of the second track 416. In some embodiments, the second set of buffer support components 482 comprises buffer support components, such as a row of buffer support components, that are proximal the second portion 416*b* of the second track 416. In some embodiments, the one or more second buffer support components are used to temporarily store one or more carriers carrying one or more semiconductor wafers that are waiting to be received and/or processed using the second processing station 402.

In some embodiments, a buffer support component of the one or more second buffer support components is used for storing a carrier that is scheduled to be subject to a process using the second processing station 402. In some embodiments, the buffer support component is used to store the carrier during a time period prior to a time at which the carrier is scheduled to receive and/or process the carrier. In some embodiments, the buffer support component is used to store the carrier while the second processing station 402 is at least one of occupied or not receptive to a semiconductor wafer carried by the carrier. In some embodiments, the buffer support component is used to store the carrier during a down time between a previous process performed on a semiconductor wafer carried by the carrier and a subsequent process scheduled to be performed on the semiconductor wafer using the second processing station 402. In some embodiments, the carrier is transferred from the buffer support component to the second processing station 402 responsive to the second processing station 402 becoming available to receive the semiconductor wafer.

In some embodiments, one or more carriers are stored using one or more buffer support component of the one or more second buffer support components. In some embodiments, the one or more carriers comprises at least one of a carrier 403*a*, a carrier 403*b*, or a carrier 403*c*. In some embodiments, the automated material handling system 100 comprises a transport vehicle 478 traveling along a travel path 472 from the second track 416 to the first track 412 to transfer the carrier 403*b* to the second processing station 402 after receiving the carrier 403*b* from the third buffer support component 406*c*. In some embodiments, the automated material handling system 100 comprises at least one of a transport vehicle 415, a transport vehicle 484, a transport vehicle 488, a transport vehicle 490, or a transport vehicle 492.

Figure 5:
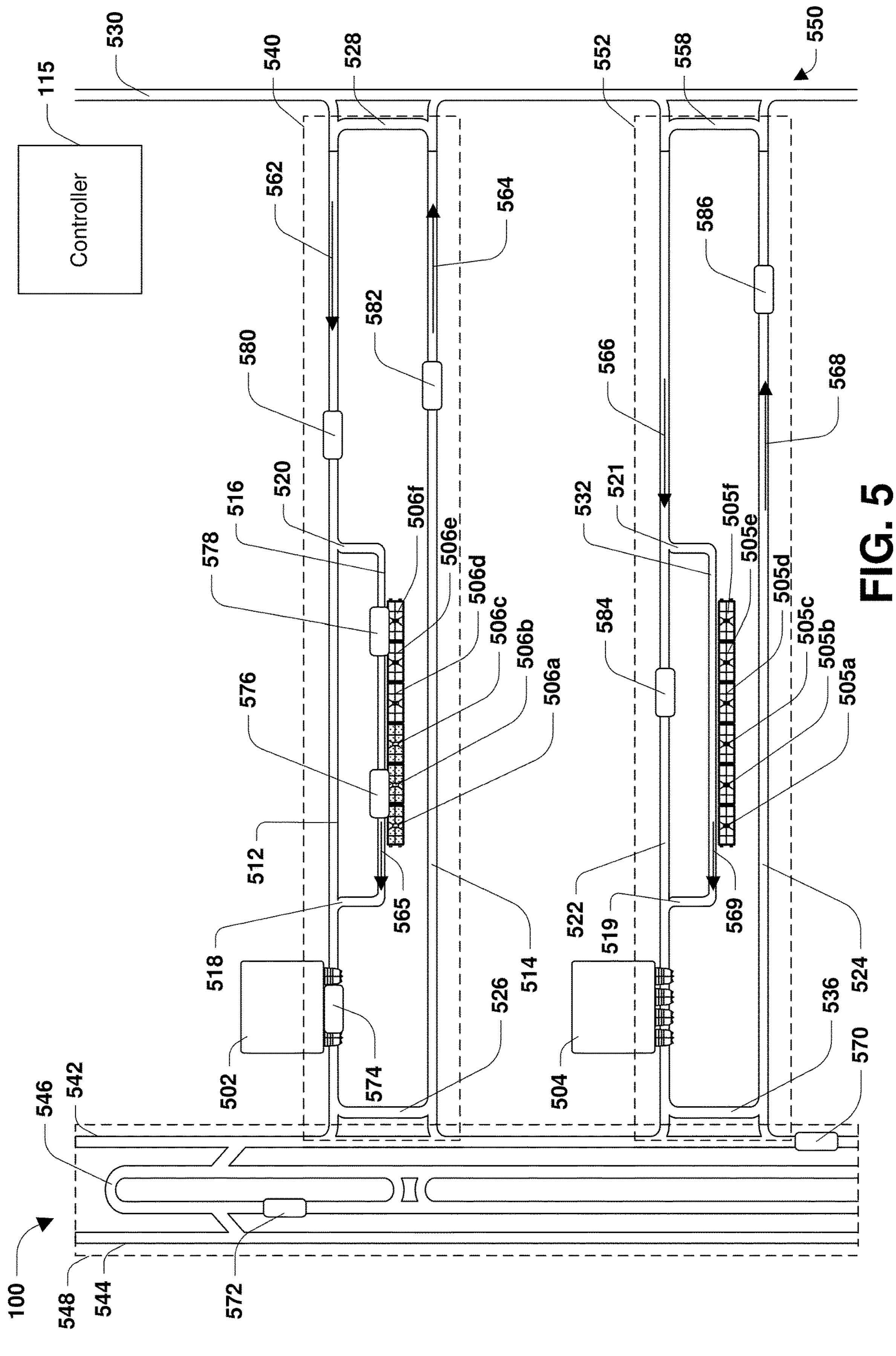
FIG. 5 illustrates a top view of an automated material handling system, in accordance with some embodiments.

FIG. 5 illustrates the automated material handling system 100 with a third transport track system 550, according to some embodiments. In some embodiments, the third transport track system 550 is configured to facilitate movement of a transport vehicle to transport a semiconductor wafer to one or more locations within the semiconductor manufacturing environment. In some embodiments, the controller 115 is configured to manage movement of transport vehicles along one or more tracks of the third transport track system 550. In some embodiments, some or all components shown in and/or discussed with respect to FIG. 5 have some or all features, structures, relationships with other elements, etc. provided herein with respect to FIGS. 1A-1M.

In some embodiments, the semiconductor manufacturing environment comprises at least one of a third processing station 502 or a fourth processing station 504. In some embodiments, the third processing station 502 comprises a semiconductor fabrication station. In some embodiments, the third processing station 502 is configured to perform a process, such as a semiconductor fabrication process, on a semiconductor wafer. In some embodiments, the third processing station 502 comprises at least one of cleaning equipment, PVD equipment, plating equipment, etching equipment, lithography equipment, CMP equipment, CVD equipment, a furnace, or other equipment. In some embodiments, the fourth processing station 504 comprises a semiconductor fabrication station. In some embodiments, the fourth processing station 504 is configured to perform a process, such as a semiconductor fabrication process, on a semiconductor wafer. In some embodiments, the fourth processing station 504 comprises at least one of cleaning equipment, PVD equipment, plating equipment, etching equipment, lithography equipment, CMP equipment, CVD equipment, a furnace, or other equipment.

In some embodiments, the third transport track system 550 comprises a third plurality of tracks. In some embodiments, each track of one, some, or all of the third plurality of tracks comprises one or more rails, races, sidewalls, etc. and is configured to accommodate a transport vehicle of the automated material handling system 100. In some embodiments, each track of one, some, or all of the third plurality of tracks comprises at least one of metal, phenolic, nylon, or other suitable material. In some embodiments, at least some of a track of the third plurality of tracks is suspended from a ceiling. In some embodiments, at least some of a track of the third plurality of tracks is erected from at least one of a floor or a wall. In some embodiments, at least some of a track of the third plurality of tracks is erected using a lattice support structure.

In some embodiments, the third plurality of tracks comprises at least one of a first track 512, a second track 516, a third track 514, a fourth track 546, a fifth track 526, a sixth track 528, a seventh track 530, an eighth track 542, a ninth track 544, a tenth track 522, an eleventh track 532, a twelfth track 524, a thirteenth track 536, a fourteenth track 558, or one or more other suitable tracks. In some embodiments, the third transport track system 550 comprises a plurality of track system segments. In some embodiments, the plurality of track system segments comprises at least one of a first track system segment 540, a second track system segment 548, a third track system segment 552, or one or more other suitable track system segments. In some embodiments, the first track system segment 540 comprises an intra-bay segment for transporting a carrier from one location within a first bay to another location within the first bay. In some embodiments, the first track system segment 540 comprises at least one of the first track 512, the second track 516, the third track 514, the fifth track 526, the sixth track 528, or one or more other suitable tracks. In some embodiments, the second track system segment 548 comprises an inter-bay segment for transporting a carrier from a first bay to a second bay different than the first bay. In some embodiments, the second track system segment 548 comprises at least one of the eighth track 542, the ninth track 544, the fourth track 546, or one or more other suitable tracks. In some embodiments, the third track system segment 552 comprises an intra-bay segment for transporting a carrier from one location within a second bay to another location within the second bay. In some embodiments, the third track system segment 552 comprises at least one of the tenth track 522, the eleventh track 532, the twelfth track 524, the thirteenth track 536, the fourteenth track 558, or one or more other suitable tracks. In some embodiments, the second track 516 is at least one of detachable from the first track 512 or attachable to the first track 512. In some embodiments, the eleventh track 532 is at least one of detachable from the tenth track 522 or attachable to the tenth track 522.

In some embodiments, a transport vehicle of the automated material handling system 100 travels along the first track 512. According to some embodiments, the transport vehicle is maintained on the first track 512 using guide rails, guard rails, etc. In some embodiments, the first track 512 is configured to facilitate movement of a transport vehicle in a first direction 562. In some embodiments, the third track 514 is configured to facilitate movement of a transport vehicle in a second direction 564 different than the first direction 562. In some embodiments, the second direction 564 is opposite the first direction 562.

In some embodiments, the second track 516 is connected to the first track 512 via at least one of a first junction 518 or a second junction 520. In some embodiments, the second track 516 comprises a side track. In some embodiments, the second track 516 comprises a track loop. In some embodiments, the second track 516 is configured to facilitate movement of a transport vehicle in a third direction 565. In some embodiments, the first junction 518 comprises a first transfer component (not shown), such as at least one of a switch, a turnout, etc., that facilitates transfer of a transport vehicle traveling along the second track 516 to traveling along the first track 512. In some embodiments, the second junction 520 comprises a second transfer component (not shown), such as at least one of a switch, a turnout, etc., that facilitates transfer of a transport vehicle traveling along the first track 512 to traveling along the second track 516.

In some embodiments, the automated material handling system 100 comprises one or more third buffer support components comprising at least one of a first buffer support component 506*a*, a second buffer support component 506*b*, a third buffer support component 506*c*, a fourth buffer support component 506*d*, a fifth buffer support component 506*e*, or a sixth buffer support component 506*f*. In some embodiments, a buffer support component of the one or more third buffer support components is used for storing a carrier that is scheduled to be subject to a process using the third processing station 502. In some embodiments, the buffer support component is used to store the carrier during a time period prior to a time at which the carrier is scheduled to receive and/or process the carrier. In some embodiments, the buffer support component is used to store the carrier while the third processing station 502 is at least one of occupied or not receptive to a semiconductor wafer carried by the carrier. In some embodiments, the buffer support component is used to store the carrier during a down time between a previous process performed on a semiconductor wafer carried by the carrier and a subsequent process scheduled to be performed on the semiconductor wafer using the third processing station 502. In some embodiments, the carrier is transferred from the buffer support component to the third processing station 502 responsive to the third processing station 502 becoming available to receive the semiconductor wafer.

In some embodiments, a transport vehicle of the automated material handling system 100 travels along the tenth track 522. According to some embodiments, the transport vehicle is maintained on the tenth track 522 using guide rails, guard rails, etc. In some embodiments, the tenth track 522 is configured to facilitate movement of a transport vehicle in a fourth direction 566. In some embodiments, the twelfth track 524 is configured to facilitate movement of a transport vehicle in a fifth direction 568 different than the fourth direction 566. In some embodiments, the fifth direction 568 is opposite the fourth direction 566.

In some embodiments, the eleventh track 532 is connected to the tenth track 522 via at least one of a third junction 519 or a fourth junction 521. In some embodiments, the eleventh track 532 comprises a side track. In some embodiments, the eleventh track 532 comprises a track loop. In some embodiments, the eleventh track 532 is configured to facilitate movement of a transport vehicle in a sixth direction 569. In some embodiments, the third junction 519 comprises a third transfer component (not shown), such as at least one of a switch, a turnout, etc., that facilitates transfer of a transport vehicle traveling along the eleventh track 532 to traveling along the tenth track 522. In some embodiments, the fourth junction 521 comprises a fourth transfer component (not shown), such as at least one of a switch, a turnout, etc., that facilitates transfer of a transport vehicle traveling along the tenth track 522 to traveling along the eleventh track 532.

In some embodiments, the automated material handling system 100 comprises one or more fourth buffer support components comprising at least one of a seventh buffer support component 505*a*, an eighth buffer support component 505*b*, a ninth buffer support component 505*c*, a tenth buffer support component 505*d*, an eleventh buffer support component 505*e*, or a twelfth buffer support component 505*f*. In some embodiments, a buffer support component of the one or more fourth buffer support components is used for storing a carrier that is scheduled to be subject to a process using the fourth processing station 504. In some embodiments, the buffer support component is used to store the carrier during a time period prior to a time at which the carrier is scheduled to receive and/or process the carrier. In some embodiments, the buffer support component is used to store the carrier while the fourth processing station 504 is at least one of occupied or not receptive to a semiconductor wafer carried by the carrier. In some embodiments, the buffer support component is used to store the carrier during a down time between a previous process performed on a semiconductor wafer carried by the carrier and a subsequent process scheduled to be performed on the semiconductor wafer using the fourth processing station 504. In some embodiments, the carrier is transferred from the buffer support component to the fourth processing station 504 responsive to the fourth processing station 504 becoming available to receive the semiconductor wafer.

In some embodiments, the automated material handling system 100 comprises at least one of a transport vehicle 570, a transport vehicle 572, a transport vehicle 574, a transport vehicle 576, a transport vehicle 578, a transport vehicle 580, a transport vehicle 582, a transport vehicle 584, or a transport vehicle 586.

Figure 6:
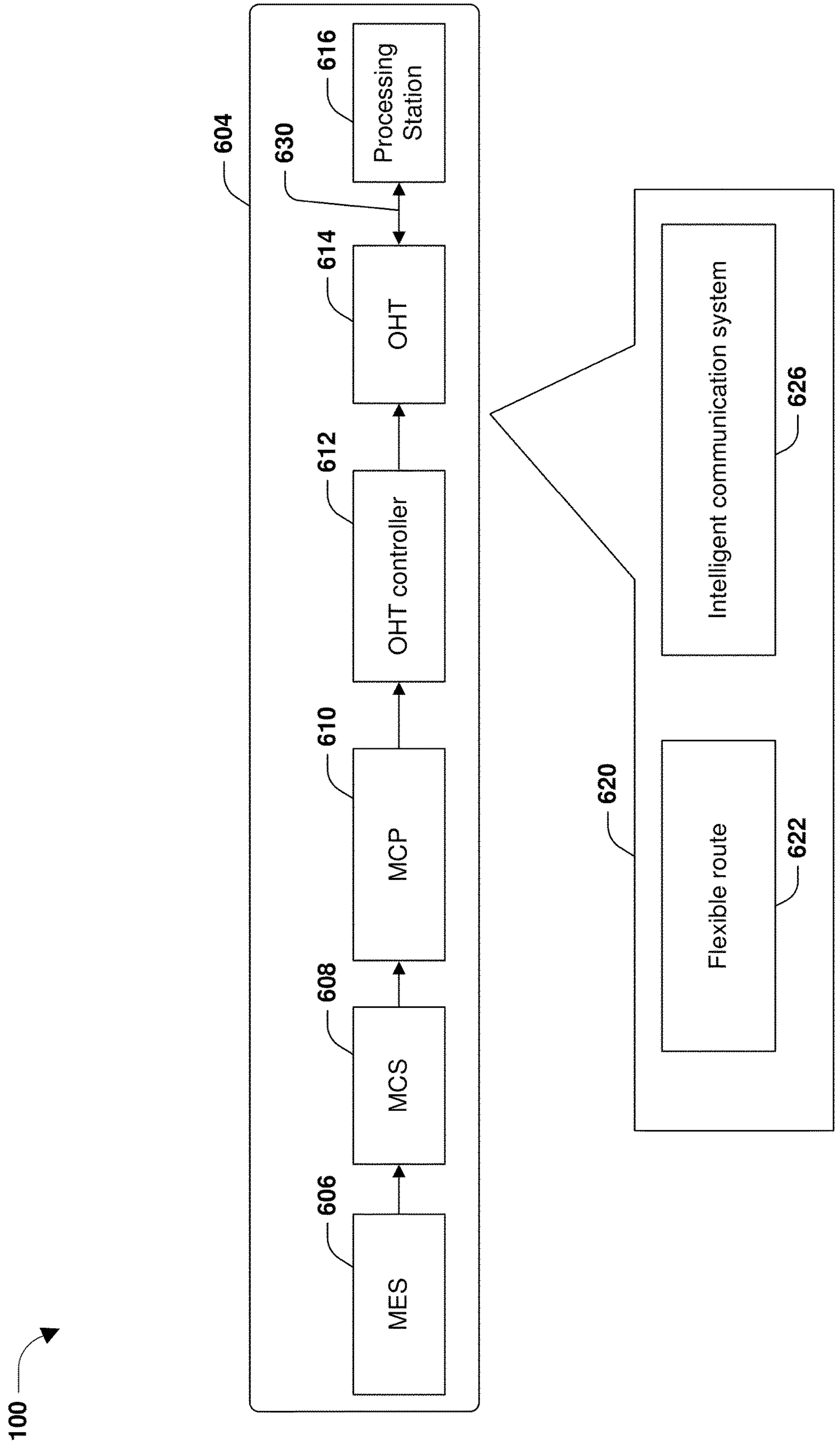
FIG. 6 illustrates a component block diagram of an automated material handling system, in accordance with some embodiments.

FIG. 6 illustrates the automated material handling system 100, in accordance with some embodiments. In some embodiments, the automated material handling system 100 comprises a transfer automation system 604 and a transport vehicle control system 620. In some embodiments, the transfer automation system 604 comprises at least one of a manufacturing execution system (MES) 606, a material control system (MCS) 608, a material control planner (MCP) 610, a transportation controller 612 such as an overhead hoist transport (OHT) controller, a transport vehicle 614 such as an OHT vehicle, or a processing station 616. In some embodiments, the controller 115 comprises the transportation controller 612. In some embodiments, the transport vehicle 614 comprises at least one of the first transport vehicle 152, the second transport vehicle 178, the third transport vehicle 180, the fourth transport vehicle 196, the fifth transport vehicle 105, or other transport vehicle of the automated material handling system 100. In some embodiments, the processing station 616 comprises at least one of the first processing station 102, the second processing station 402, the third processing station 502, or the fourth processing station 504.

In some embodiments, the transport vehicle control system 620 comprises at least one of a flexible route 622 or a communication system 626, such as an intelligent communication system. In some embodiments, the flexible route 622 comprises at least one of the second track 104, the one or more first buffer support components, the second track 416, the one or more second buffer support components, the second track 516, the eleventh track 532, or the one or more third buffer support components. In some embodiments, the communication system 626 comprises at least one of a wired communication system, a wireless communication system, a Bluetooth communication system, a WiFi communication system, an E84 communication system, or other type of communication system. In some embodiments, components of the automated material handling system 100 communicate with each other using the communication system 626. In some embodiments, the transport vehicle 614 communicates 630 with the processing station 616 using the communication system 626. In some embodiments, the transport vehicle control system 620 performs pattern recognition to identify patterns in movement of transport vehicles of the automated material handling system 100, and adjusts one or more parameters of the transport vehicle 614 based upon the identified patterns.

Figure 7:
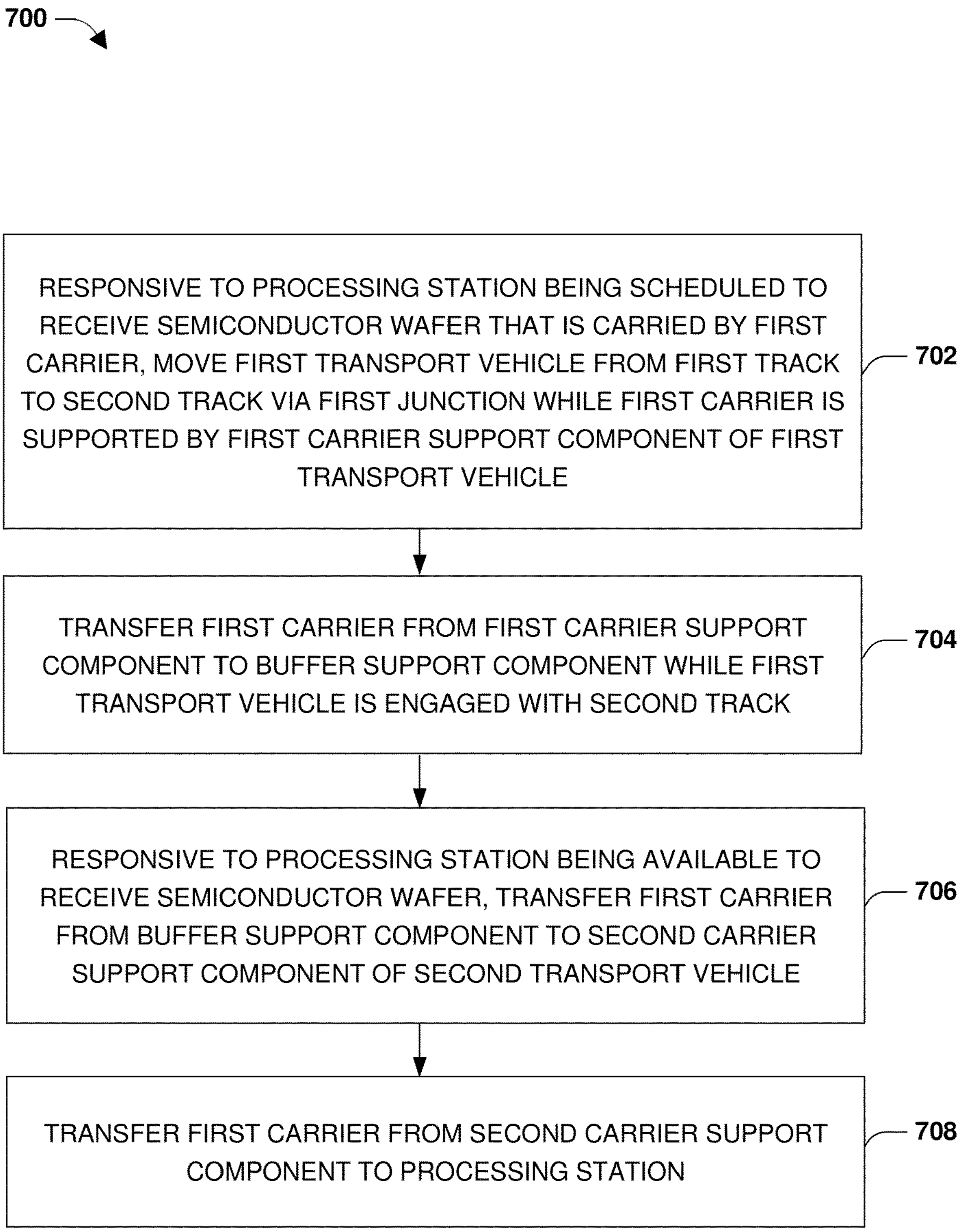
FIG. 7 is a flow diagram illustrating a method, in accordance with some embodiments.

A method 700 of transporting a first carrier using an automated material handling system is illustrated in FIG. 7 in accordance with some embodiments. In some embodiments, the automated material handling system comprises a first transport vehicle, a second transport vehicle, a buffer support component, and a transport track system comprising a first track and a second track connected to the first track via a first junction. At 702, responsive to a processing station being scheduled to receive a semiconductor wafer that is carried by the first carrier, the first transport vehicle is moved from the first track to the second track via the first junction while the first carrier is supported by a first carrier support component of the first transport vehicle. At 704, the first carrier is transferred from the first carrier support component to the buffer support component while the first transport vehicle is engaged with the second track. At 706, responsive to the processing station being available to receive the semiconductor wafer, the first carrier is transferred from the buffer support component to a second carrier support component of the second transport vehicle. At 708, the first carrier is transferred from the second carrier support component to the processing station.

In some embodiments, the second track is connected to the first track via a second junction. In some embodiments, responsive to transferring the first carrier from the buffer support component to the second carrier support component, the second transport vehicle is moved from the second track to the first track via the second junction. In some embodiments, the first carrier is transferred from the second carrier support component to the processing station while the second transport vehicle is engaged with the first track.

In some embodiments, the automated material handling system comprises a third transport vehicle. In some embodiments, the transport track system comprises a third track connected to the first track via a third junction. In some embodiments, the processing station is used to process the semiconductor wafer to produce a processed semiconductor wafer. In some embodiments, the processed semiconductor wafer is loaded into the first carrier. In some embodiments, responsive to loading the processed semiconductor wafer into the first carrier, the first carrier is transferred from the processing station to a third carrier support component of the third transport vehicle. In some embodiments, responsive to loading the processed semiconductor wafer into the first carrier, the first carrier is transferred from the processing station to a third carrier support component of the third transport vehicle. In some embodiments, responsive to transferring the first carrier from the processing station to the third carrier support component, the third transport vehicle is moved from the first track to the third track via the third junction.

In some embodiments, a fourth transport vehicle is allowed to travel along the third track while the first carrier is received at the third carrier support component. In some embodiments, the fourth transport vehicle is allowed to travel along the third track during a transfer operation during which the first carrier is transferred from the processing station to the third carrier support component of the third transport vehicle. In some embodiments, the fourth transport vehicle is allowed to travel along the third track based upon the first transfer operation being underway and/or incomplete. In some embodiments, a fifth transport vehicle is blocked from traveling along the third track responsive to the first carrier being received by the third carrier support component to allow the third transport vehicle to travel from the first track to the third track via the third junction. In some embodiments, the fifth transport vehicle is blocked from traveling along the third track responsive to completing the first transport operation.

In some embodiments, the transport track system discussed with respect to the method 700 comprises the first transport track system 150 shown in and/or discussed with respect to FIGS. 1A-1M. In some embodiments, at least one of (i) the first transport vehicle discussed with respect to the method 700 comprises the first transport vehicle 152, (ii) the second transport vehicle discussed with respect to the method 700 comprises the second transport vehicle 178, (iii) the third transport vehicle discussed with respect to the method 700 comprises the third transport vehicle 180, (iv) the fourth transport vehicle discussed with respect to the method 700 comprises the fourth transport vehicle 196, (v) the fifth transport vehicle discussed with respect to the method 700 comprises the fifth transport vehicle 105, (vi) the first track discussed with respect to the method 700 comprises the first track 112, (vii) the second track discussed with respect to the method 700 comprises the second track 104, (viii) the first junction discussed with respect to the method 700 comprises the first junction 108, (ix) the second junction discussed with respect to the method 700 comprises the second junction 110, (x) the third track discussed with respect to the method 700 comprises the eighth track 142, (xi) the processing station discussed with respect to the method 700 comprises the first processing station 102, or (xii) the buffer support component discussed with respect to the method 700 comprises a buffer support component of the one or more first buffer support components.

In some embodiments, the transport track system discussed with respect to the method 700 comprises the second transport track system 450 shown in and/or discussed with respect to FIG. 4. In some embodiments, at least one of (i) the first track discussed with respect to the method 700 comprises at least one of the first track 412 or the third track 414, (ii) the second track discussed with respect to the method 700 comprises the second track 416, (iii) the first junction discussed with respect to the method 700 comprises at least one of the second junction 420 or the third junction 422, (iv) the second junction discussed with respect to the method 700 comprises at least one of the first junction 418 or the fourth junction 424, (v) the third track discussed with respect to the method 700 comprises the eighth track 442, (vi) the processing station discussed with respect to the method 700 comprises the second processing station 402, or (vii) the buffer support component discussed with respect to the method 700 comprises a buffer support component of the one or more second buffer support components.

In some embodiments, the transport track system discussed with respect to the method 700 comprises the third transport track system 550 shown in and/or discussed with respect to FIG. 5. In some embodiments, at least one of (i) the first track discussed with respect to the method 700 comprises at least one of the first track 512 or the tenth track 522, (ii) the second track discussed with respect to the method 700 comprises at least one of the second track 516 or the eleventh track 532, (iii) the first junction discussed with respect to the method 700 comprises at least one of the second junction 520 or the fourth junction 521, (iv) the second junction discussed with respect to the method 700 comprises at least one of the first junction 518 or the third junction 519, (v) the third track discussed with respect to the method 700 comprises the eighth track 542, (vi) the processing station discussed with respect to the method 700 comprises at least one of the third processing station 502 or the fourth processing station 504, or (vii) the buffer support component discussed with respect to the method 700 comprises at least one of a buffer support component of the one or more third buffer support components or a buffer support component of the one or more fourth buffer support components.

In some embodiments, the first transport vehicle discussed with respect to the method 700 is the same transport vehicle as the second transport vehicle discussed with respect to the method 700. For example, in accordance with some embodiments, the same transport vehicle that is used to transfer the first carrier to the buffer support component is used to at least one of receive the first carrier from the buffer support component or transfer the first carrier to the processing station.

In some embodiments, the second transport vehicle discussed with respect to the method 700 is the same transport vehicle as the third transport vehicle discussed with respect to the method 700.

In some embodiments, the first transport vehicle discussed with respect to the method 700 is the same transport vehicle as the third transport vehicle discussed with respect to the method 700.

Figure 8:
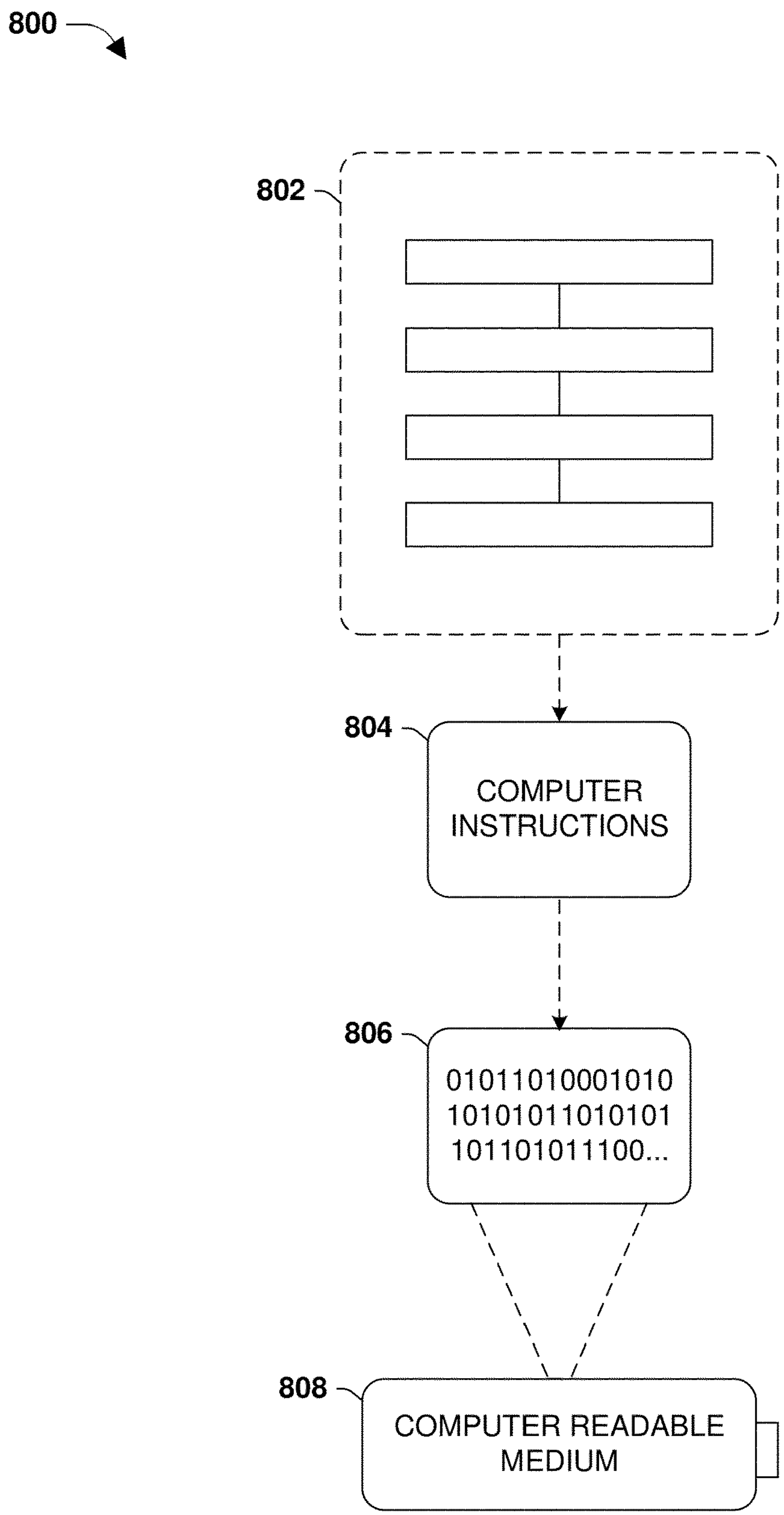
FIG. 8 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 8, wherein the embodiment 800 comprises a computer-readable medium 808 (e.g., a CD-R, DVD-R, flash drive, a platter of a hard disk drive, etc.), on which is encoded computer-readable data 806. This computer-readable data 806 in turn comprises a set of processor-executable computer instructions 804 configured to implement one or more of the principles set forth herein when executed by a processor. In some embodiments 800, the processor-executable computer instructions 804 are configured to implement a method 802, such as at least some of the aforementioned method(s) when executed by a processor. In some embodiments, the processor-executable computer instructions 804 are configured to implement a system, such as at least some of the one or more aforementioned systems when executed by a processor. In some embodiments, the processor-executable computer instructions 804 are configured to implement an apparatus, such as at least some of the one or more aforementioned apparatuses when executed by a processor. Many such computer-readable media may be devised by those of ordinary skill in the art that are configured to operate in accordance with the techniques presented herein.

In some embodiments, an automated material handling system is provided. The automated material handling system includes a first transport vehicle including a first carrier support component configured to support a first carrier carrying a semiconductor wafer. The automated material handling system includes a transport track system configured to facilitate movement of the first transport vehicle. The transport track system includes a first track and a second track connected to the first track via a first junction. The automated material handling system includes a buffer support component configured to support the first carrier. The automated material handling system includes a second transport vehicle including a second carrier support component. Responsive to a processing station being scheduled to receive the semiconductor wafer, the first transport vehicle is configured to (i) travel from the first track to the second track via the first junction while the first carrier is supported by the first carrier support component, and (ii) transfer the first carrier from the first carrier support component to the buffer support component while the first transport vehicle is engaged with the second track. Responsive to the processing station being available to receive the semiconductor wafer, the second transport vehicle is configured to (i) receive the first carrier from the buffer support component using the second carrier support component, and (ii) transfer the first carrier from the second carrier support component to the processing station.

In some embodiments, a method of transporting a first carrier using an automated material handling system is provided. The automated material handling system includes a first transport vehicle, a second transport vehicle, a buffer support component, and a transport track system including a first track and a second track connected to the first track via a first junction. The method includes responsive to a processing station being scheduled to receive a semiconductor wafer that is carried by the first carrier, moving the first transport vehicle from the first track to the second track via the first junction while the first carrier is supported by a first carrier support component of the first transport vehicle. The method includes transferring the first carrier from the first carrier support component to the buffer support component while the first transport vehicle is engaged with the second track. The method includes responsive to the processing station being available to receive the semiconductor wafer, transferring the first carrier from the buffer support component to a second carrier support component of the second transport vehicle. The method includes transferring the first carrier from the second carrier support component to the processing station.

In some embodiments, a method of transporting a first carrier using an automated material handling system is provided. The automated material handling system includes a first transport vehicle, a buffer support component, and a transport track system including a first track and a second track connected to the first track via a first junction. The method includes responsive to a processing station being scheduled to receive a semiconductor wafer that is carried by the first carrier, moving the first transport vehicle from the first track to the second track via the first junction while the first carrier is supported by a first carrier support component of the first transport vehicle. The method includes transferring the first carrier from the first carrier support component to the buffer support component while the first transport vehicle is engaged with the second track. The method includes responsive to the processing station being available to receive the semiconductor wafer, transferring the first carrier from the buffer support component to the first carrier support component. The method includes transferring the first carrier from the first carrier support component to the processing station.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" and/or the like is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An automated material handling system, comprising:

a first transport vehicle comprising a first carrier support component configured to support a first carrier carrying a semiconductor wafer;

a transport track system configured to facilitate movement of the first transport vehicle, wherein the transport track system comprises:

a first track configured to facilitate movement of the first transport vehicle in a first direction; and a second track connected to the first track via a first junction;

a buffer support component configured to support the first carrier and disposed along the second track at a location where the second track facilitates movement of the first transport vehicle in a second direction non-parallel to the first direction; and a second transport vehicle comprising a second carrier support component, wherein:

responsive to a processing station being scheduled to receive the semiconductor wafer, the first transport vehicle is configured to:

travel from the first track to the second track via the first junction while the first carrier is supported by the first carrier support component; and transfer the first carrier from the first carrier support component to the buffer support component at the location where the second track facilitates movement of the first transport vehicle in the second direction while the first transport vehicle is engaged with the second track; and responsive to the processing station being available to receive the semiconductor wafer, the second transport vehicle is configured to:

receive the first carrier from the buffer support component using the second carrier support component; and transfer the first carrier from the second carrier support component to the processing station wherein:

the processing station is disposed along the first track such that the first carrier is transferred to the processing station while the second transport vehicle is disposed on the first track; and a longest dimension of the first track is non-parallel to a longest dimension of the second track.

2. The automated material handling system of claim 1, wherein:

the second track is connected to the first track via a second junction; and responsive to receiving the first carrier using the second carrier support component, the second transport vehicle is configured to travel from the second track to the first track via the second junction.

3. The automated material handling system of claim 1, wherein:

the transport track system comprises a third track that is at least one of:

substantially parallel to the first track; or configured to facilitate movement of a transport vehicle in a third direction different than the first direction.

4. The automated material handling system of claim 1, wherein:

the second track comprises a loop track comprising:

a first portion configured to facilitate movement of the first carrier in the second direction; and a second portion that is at least one of:

substantially parallel to the first portion of the second track; or configured to facilitate movement of a carrier in a third direction different than the second direction.

5. The automated material handling system of claim 3, wherein:

the first track is between the second track and the third track.

6. The automated material handling system of claim 1, comprising:

a third transport vehicle comprising a third carrier support component, wherein:

the transport track system comprises a third track configured to facilitate movement of the third transport vehicle in a third direction non-parallel to the first direction;

the third track is connected to the first track via a third junction; and responsive to the processing station using the semiconductor wafer to produce a processed semiconductor wafer and the processed semiconductor wafer being loaded into the first carrier, the third transport vehicle is configured to:

receive, using the third carrier support component, the first carrier from the processing station; and travel from the first track to the third track via the third junction while the first carrier is supported by the third carrier support component.

7. The automated material handling system of claim 6, comprising:

a controller configured to manage movement of transport vehicles along the third track, wherein:

the controller allows a fourth transport vehicle to travel along the third track while the first carrier is received using the third carrier support component; and responsive to the first carrier being received using the third carrier support component, the controller blocks a fifth transport vehicle from traveling along the third track to allow the third transport vehicle to travel from the first track to the third track via the third junction.

8. The automated material handling system of claim 1, wherein the first junction comprises:

a first transfer component configured to facilitate transfer of the first transport vehicle from traveling along the first track to traveling along the second track.

9. The automated material handling system of claim 1, wherein:

the first carrier is received using the second carrier support component while the second transport vehicle is engaged with the second track.

10. A method of transporting a first carrier using an automated material handling system comprising a first transport vehicle, a second transport vehicle, a third transport vehicle, a buffer support component, and a transport track system comprising a first track and a second track connected to the first track via a first junction, the method comprising:

responsive to a processing station being scheduled to receive a semiconductor wafer that is carried by the first carrier, moving the first transport vehicle from the first track to the second track via the first junction while the first carrier is supported by a first carrier support component of the first transport vehicle;

transferring the first carrier from the first carrier support component to the buffer support component while the first transport vehicle is engaged with the second track;

responsive to the processing station being available to receive the semiconductor wafer, transferring the first carrier from the buffer support component to a second carrier support component of the second transport vehicle;

transferring the first carrier from the second carrier support component to the processing station; and after the processing station completes processing of the semiconductor wafer, transferring the first carrier from the processing station to a third carrier support component of the third transport vehicle and assigning a priority to the third transport vehicle relative to the first transport vehicle and the second transport vehicle, wherein:

the processing station is disposed along the first track such that the first carrier is transferred to the processing station while the second transport vehicle is disposed on the first track; and a longest dimension of the first track is non-parallel to a longest dimension of the second track.

11. The method of claim 10, comprising:

transferring the semiconductor wafer from the first carrier into the processing station via a load port of the processing station.

12. The method of claim 11, comprising:

responsive to transferring the semiconductor wafer from the first carrier into the processing station via the load port, processing the semiconductor wafer using the processing station.

13. The method of claim 10, wherein:

the second track is connected to the first track via a second junction; and the method comprises responsive to transferring the first carrier from the buffer support component to the second carrier support component, moving the second transport vehicle from the second track to the first track via the second junction.

14. The method of claim 10, wherein:

a processed semiconductor wafer is produced after the processing station completes processing of the semiconductor wafer;

the transport track system comprises a third track;

the third track is connected to the first track via a third junction; and the method comprises:

loading the processed semiconductor wafer into the first carrier; and responsive to transferring the first carrier from the processing station to the third carrier support component, moving the third transport vehicle from the first track to the third track via the third junction.

15. The method of claim 14, comprising:

allowing a fourth transport vehicle to travel along the third track while the first carrier is received at the third carrier support component; and blocking a fifth transport vehicle from traveling along the third track responsive to the first carrier being received by the third carrier support component to allow the third transport vehicle to travel from the first track to the third track via the third junction.

16. The method of claim 10, wherein the priority is based upon at least one of:

a scheduled time of a subsequent process scheduled to be performed on the semiconductor wafer, a scheduled production time corresponding to a time at which fabrication of the semiconductor wafer stored in the first carrier is scheduled to be completed, a delivery time requirement corresponding to a duration of time within which the first carrier is required to be delivered to a second processing station or a stocking location, a sensitivity of the semiconductor wafer stored in the first carrier, or a priority value assigned to the semiconductor wafer stored in the first carrier.

17. An automated material handling system, comprising:

a first transport vehicle comprising a first carrier support component configured to support a first carrier carrying a semiconductor wafer;

a transport track system configured to facilitate movement of the first transport vehicle, wherein the transport track system comprises:

a first track; and a second track connected to the first track via a first junction;

a buffer support component configured to support the first carrier;

a second transport vehicle comprising a second carrier support component, wherein:

responsive to a processing station being scheduled to receive the semiconductor wafer, the first transport vehicle is configured to:

travel from the first track to the second track via the first junction while the first carrier is supported by the first carrier support component; and transfer the first carrier from the first carrier support component to the buffer support component while the first transport vehicle is engaged with the second track; and responsive to the processing station being available to receive the semiconductor wafer, the second transport vehicle is configured to:

receive the first carrier from the buffer support component using the second carrier support component; and transfer the first carrier from the second carrier support component to the processing station; and a first track coupling component and a second track coupling component configured to selectively receive a track assembly comprising supplemental track and an additional buffer support component, wherein the track assembly is detachably coupled to the first track coupling component and the second track coupling component, the first track coupling component is coupled to the first track, and the second track coupling component is coupled to the first track, wherein:

the processing station is disposed along the first track such that the first carrier is transferred to the processing station while the second transport vehicle is disposed on the first track; and a longest dimension of the first track is non-parallel to a longest dimension of the second track.

18. The automated material handling system of claim 17, wherein the supplemental track is substantially u-shaped.

19. The automated material handling system of claim 17, wherein:

the second track is connected to the first track via a second junction; and responsive to receiving the first carrier using the second carrier support component, the second transport vehicle is configured to travel from the second track to the first track via the second junction.

20. The automated material handling system of claim 17, wherein the first junction comprises:

a first transfer component configured to facilitate transfer of the first transport vehicle from traveling along the first track to traveling along the second track.

* * * * *